United States Patent [19]

Maruyama et al.

[11] Patent Number: 5,317,268
[45] Date of Patent: May 31, 1994

[54] SPARKING VOLTAGE DETECTING DEVICE FOR INTERNAL COMBUSTION ENGINES

[75] Inventors: Shigeru Maruyama; Yuichi Shimasaki; Takashi Hisaki; Masaki Kanehiro; Shigeki Baba; Takuji Ishioka, all of Wako, Japan

[73] Assignee: Honda Giken Kogyo Kabushiki Kaisha, Tokyo, Japan

[21] Appl. No.: 979,687

[22] Filed: Nov. 20, 1992

[30] Foreign Application Priority Data

Nov. 28, 1991 [JP] Japan ................................ 3-339722
Nov. 28, 1991 [JP] Japan ................................ 3-339724
Nov. 28, 1991 [JP] Japan ................................ 3-339726

[51] Int. Cl.$^5$ ............................................ G01R 13/42
[52] U.S. Cl. ................................. 324/402; 73/118.1
[58] Field of Search ............... 73/116, 118.1; 324/402, 324/395, 658, 126; 439/169

[56] References Cited

U.S. PATENT DOCUMENTS 4,041,373 8/1977 Maringer ..................... 324/126 X
4,349,782 9/1982 Doss ............................ 324/395 X

FOREIGN PATENT DOCUMENTS 52-118135 10/1977 Japan .

Primary Examiner—Jerry W. Myracle
Attorney, Agent, or Firm—Nikaido, Marmelstein, Murray & Oram

[57] ABSTRACT

A sparking voltage detecting device for an internal combustion engine having an ignition system having at least one secondary side high-tension cord, is mounted on the secondary side high-tension cord, for detecting sparking voltage generated in the engine. A main body formed of an insulating material has at least one through hole formed therein. The high-tension cord is fitted through the through hole in a liquidtight manner. At least one conductive member is embedded in the main body at a location radially outward of the through hole and spaced from the high-tension cord by a predetermined distance.

22 Claims, 26 Drawing Sheets

SPARKING VOLTAGE DETECTING DEVICE FOR INTERNAL COMBUSTION ENGINES

BACKGROUND OF THE INVENTION

1. Field of the Invention

This invention relates to a sparking voltage detecting for spark-ignition type internal combustion engines, which detects sparking voltage generated in the engine.

2. Prior Art

Conventionally, sparking voltage detecting devices are known, which detect sparking voltage occurring on the secondary side of an ignition system of an internal combustion engine. One of such devices is disclosed in Japanese Provisional Patent Publication (Kokai) No. 52-118135, which comprises a sensor formed of a strip of a conductive material wound on a high-tension cord connected to a spark plug. The sensor forms a capacitor having very small capacitance with a coating insulating material of the high-tension cord acting as a dielectric, the conductive material strip being serially connected to a measuring capacitor which is grounded at one end thereof. A signal voltage is generated across the measuring capacitor according to the principle of electrostatic potential division, which voltage is detected as the sparking voltage.

However, although the known sparking voltage detecting device is capable of ascertaining whether or not sparking voltage is occurring, it is unable to accurately detect waveforms of sparking voltage, because the device has a simple structure formed of a conductive material strip wound on the high-tension cord, and hence is liable to have changes in the electrostatic capacity due to vibrations, changes in the temperature (humidity), etc. As a result, the measured voltage largely varies, badly affecting the detecting accuracy and the effective life of the device. Moreover, the sensor is located close to a voltage source (high-tension cord) generating several tens thousands volts, which requires the use of an expensive protective circuit for effecting a failsafe action in the event of a high voltage leak, and hence is complicated in structure.

SUMMARY OF THE INVENTION

It is an object of the invention to provide a sparking voltage detecting device for an internal combustion engine, which has improved detecting accuracy and a prolonged life, and can dispense with the use of a protective circuit for coping with high voltage leak or the like.

It is a further object of the invention to provide a sparking voltage detecting device for an internal combustion engine, which facilitates mounting high-tension cords onto a sensor thereof, and is low in cost.

It is another object of the invention to provide a sparking voltage detecting device for an internal combustion engine, which provides an stable output indicative of the detected sparking voltage.

It is a still further object of the invention to provide a sparking voltage detecting device for an internal combustion engine, which is much less affected by external disturbances such as radio interference and external noise.

It is still another object of the invention to provide a sparking voltage detecting device for an internal combustion engine, which is light in weight and compact in size.

According to the invention, there is provided a sparking voltage detecting device for an internal combustion engine having an ignition system having at least one secondary side high-tension cord, the sparking voltage detecting device being mounted on the secondary side high-tension cord, for detecting sparking voltage generated in the engine, comprising:

a main body formed of an insulating material and having at least one through hole formed therein, the high-tension cord being fitted through the through hole in a liquidtight manner; and at least one conductive member embedded in the main body at a location radially outward of the through hole and spaced from the high-tension cord by a predetermined distance.

In an internal combustion engine having a plurality of cylinders, and an ignition system having a plurality of secondary side high-tension cords corresponding in number to the number of the cylinders, the main body has a plurality of through holes formed therein, which correspond in number to the number of the cylinders, the high-tension cords being fitted, respectively, through the through holes in a liquidtight manner. The at least one conductive member is embedded in the main body at a location radially outward of the through holes and spaced from the high-tension cords by a predetermined distance.

In a preferred form of the invention, there is provided a sparking voltage detecting device for an internal combustion engine having a plurality of cylinders, and an ignition system having a plurality of secondary side high-tension cords corresponding in number to the number of the cylinders, the sparking voltage detecting device including a sensor mounted on the secondary side high-tension cords, for detecting sparking voltage generated in the engine, the sensor comprising:

a main body formed of an insulating material and having a plurality of through holes formed therein, the through holes corresponding in number to the number of the cylinders, the high-tension cords being fitted, respectively, through the through holes in a liquidtight manner; and at least one conductive member embedded in the main body at a location radially outward of the through holes and spaced from the high-tension cords by a predetermined distance.

Advantageously, the sensor further includes at least one shielding member embedded in the main body at a location outward of the conductive member radially of the through holes.

Also advantageously, the sensor further includes at least one insulating member formed of ceramics, the insulating member being embedded in the main body at a location between the through holes and the conductive member.

Preferably, the through holes are disposed in a manner such that centers thereof are located along a line intersecting with axes thereof at right angles, the through holes being arranged at equal intervals in a direction perpendicular to the axes.

In an embodiment of the invention, the conductive member comprises a conductive member arranged at one lateral side of the main body with respect to the through holes.

In another embodiment of the invention, the conductive member comprises a pair of conductive members symmetrically arranged at opposite lateral sides of the main body with respect to the through hole.

Alternatively, the through holes are disposed in a manner such that centers thereof are located along a circle formed about a central portion of the main body, the through holes being circumferentially arranged at equal intervals.

Preferably, the through hole has a diameter larger than an outer diameter of the high-tension cord, the through hole having opposite ends thereof formed with annular lips disposed in liquidtight contact with an outer peripheral surface of the high-tension cord for preventing infiltration of water into a clearance between the through hole and the high-tension cord.

Also preferably, the sparking voltage detecting device includes a lead wire formed of a shielding wire, the lead wire being connected to the conductive member for transmitting a voltage signal generated in the conductive member.

The above and other objects, features, and advantages of the invention will become more apparent from the following detailed description taken in conjunction with the accompanying drawings.

DETAILED DESCRIPTION

The invention will be described in detail with reference to the drawings showing embodiments thereof.

Figure 1:
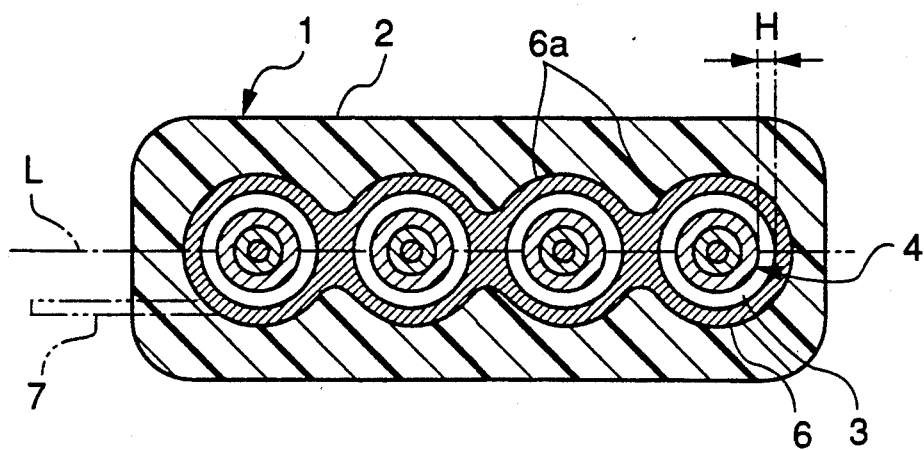
FIG. 1 is a longitudinal sectional view of a sensor of a sparking voltage detecting device for an internal combustion engine, according to a first embodiment of the invention.
Figure 2:
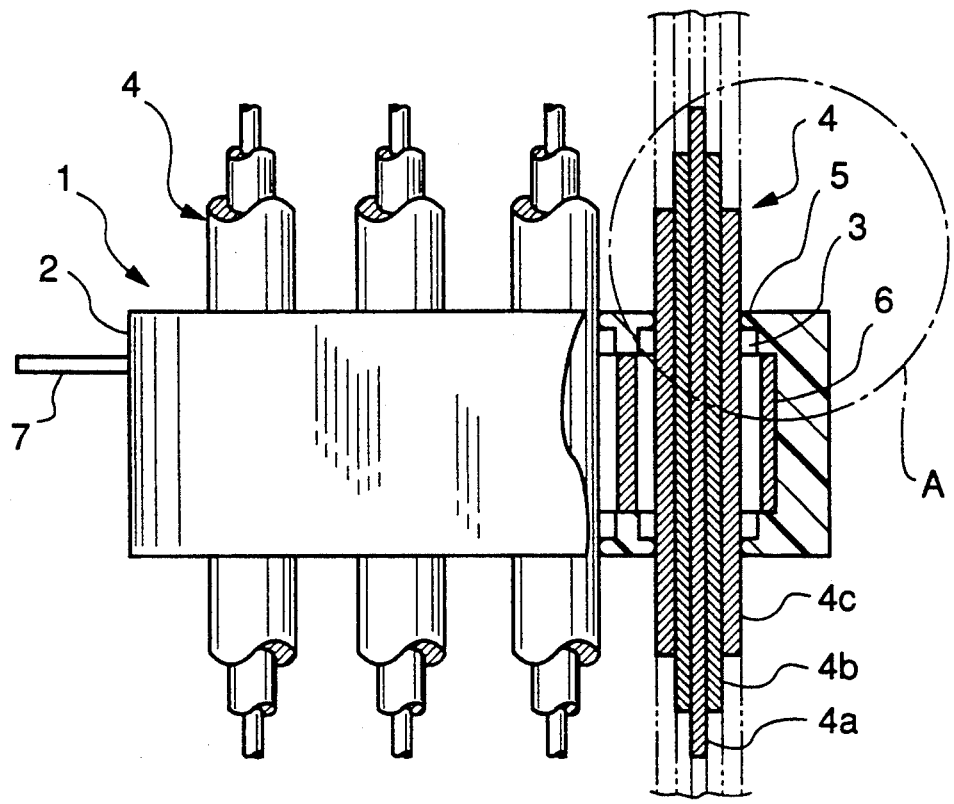
FIG. 2 is a top plan view, partly in section, of the sensor.

Referring first to FIGS. 1 and 2, there is illustrated a sensor 1, which forms an essential part of a sparking voltage detecting device for an internal combustion engine, according to a first embodiment of the invention. The sensor 1 has a main body 2 in the form of a block, which is formed of an insulating material such as rubber (EPDM) having high withstand voltage and silicon. The main body 2 has an oblong or generally rectangular cross section and is formed therein with a plurality of, e.g. four, through holes 3 corresponding in number to the number of cylinders of an engine, not shown. These through holes 3 are disposed such that their centers are located along a common line L intersecting with their axes at right angles, i.e. a line extending along the axis of the block 2. The holes 3 are arranged at equal intervals in a direction perpendicular to their axes.

Figure 3:
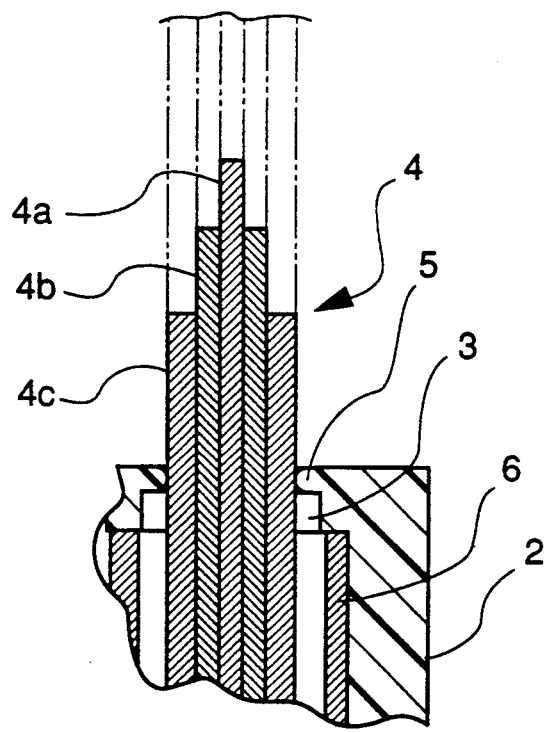
FIG. 3 is a fragmentary sectional view, on an enlarge scale, of an encircled portion A in FIG. 2.

Secondary side high-tension cords 4 of an ignition system of the engine are fitted through the through holes 3 in a liquidtight manner, respectively. These high-tension cords 4 each have a core wire 4a, and inner and outer coating layers 4b and 4c coated over the core wire 4a. The core wire 4a is comprised of a central wire formed of an aramid fiber or the like, and an outer wire formed of a Nichrome wire or the like wound around the central wire via an insulating material. The inner coating layer 4b is formed of an insulating material such as soft crosslinked polyethylene and high withstand voltage rubber (EPDM). The outer coating layer 4c is formed of an insulating material such as high withstand voltage rubber (EPDM). The diameter of each through hole 3 is larger than the outer diameter of the high-tension cords 4. Each through hole 3 has a pair of annular lips 5 formed integrally on inner peripheral surfaces of opposite ends thereof. The annular lips 5 have their inner peripheral surfaces disposed in liquidtight contact with the outer peripheral surface of the high-tension cord 4, as shown in FIG. 3, to prevent water from infiltrating into the gap between the through hole 3 and the high-tension cord 4.

A conductive member 6, which is formed of a conductive material such as copper and an alloy thereof, is embedded in the main body 2, which has cylindrical portions 6a enclosing the respective through holes 3 and each having a cylindrical shape concentric with the corresponding through hole 3. Each cylindrical portion 6a is arranged radially outward of the corresponding through hole 3 and spaced from the outer peripheral surface of the corresponding high-tension cord 4 with a predetermined clearance H therebetween. This predetermined clearance H is set at such a value that the conductive member 6 is not influenced by corona discharge from the high-tension cords 4, e.g. approximately 5–10 mm. In the illustrated embodiment, the conductive member 6 is formed in a single piece such that the cylindrical portions 6a are integrally combined with each other. Connected to one end of the conductive member 6 (the left end as viewed in FIGS. 1 and 2) is one end of a lead wire 7 formed of a shielding wire, which is comprised of a core formed of a conductive material, a shielding member formed of a conductive material and wound on the core via an insulting material, and an outer coating layer formed of an insulating material and wound on the shielding member. The lead wire 7 extends outwardly from one axial end of the main body 2 for transmitting a voltage signal from the conductive member 6 to a sparking voltage detecting unit, hereinafter referred to.

The lead wire 7 is previously connected to the conductive member 6, and then the conductive member 6 is placed into a mold for forming the block or main body 2, together with the lead wire 7, to be molded together with the main body 2.

Figure 4:
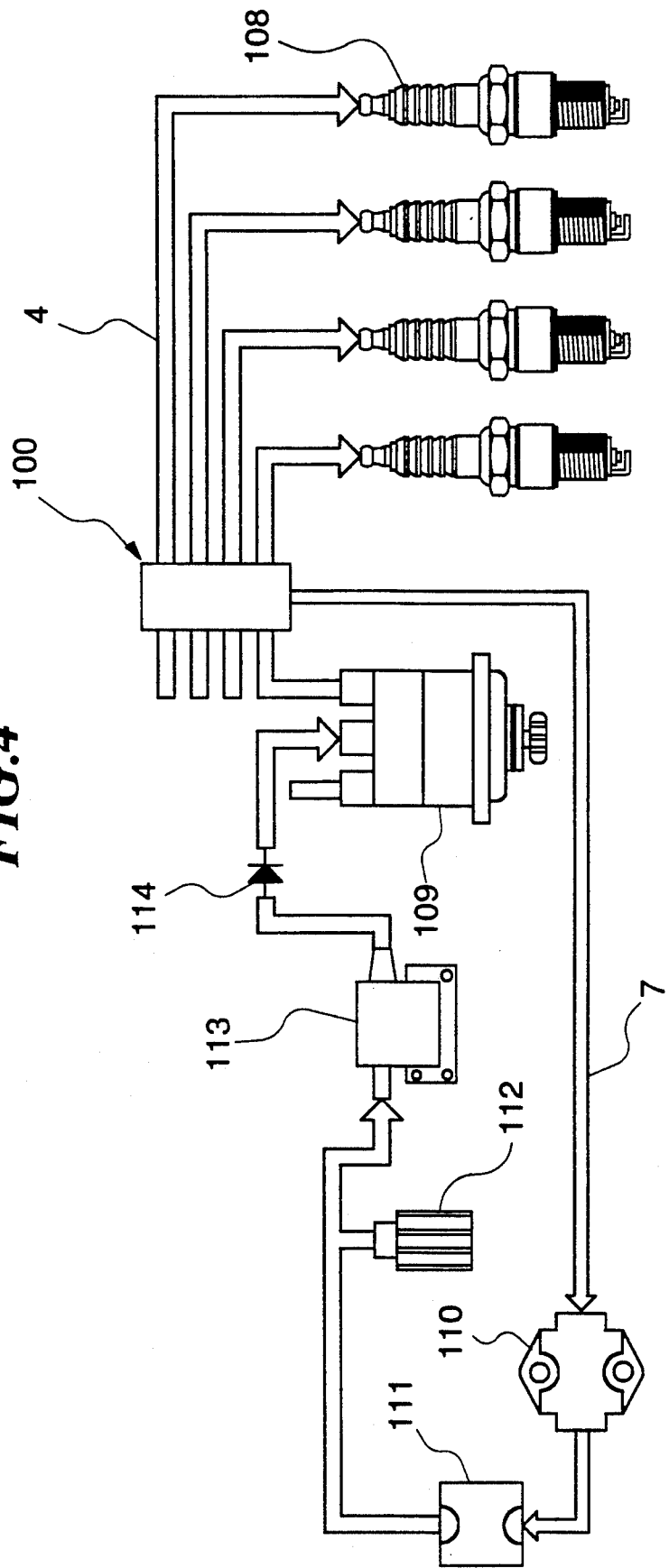
FIG. 4 is a schematic view of the whole arrangement of an ignition system of the engine, which is provided with the sparking voltage detecting device according to the invention.
Figure 5:
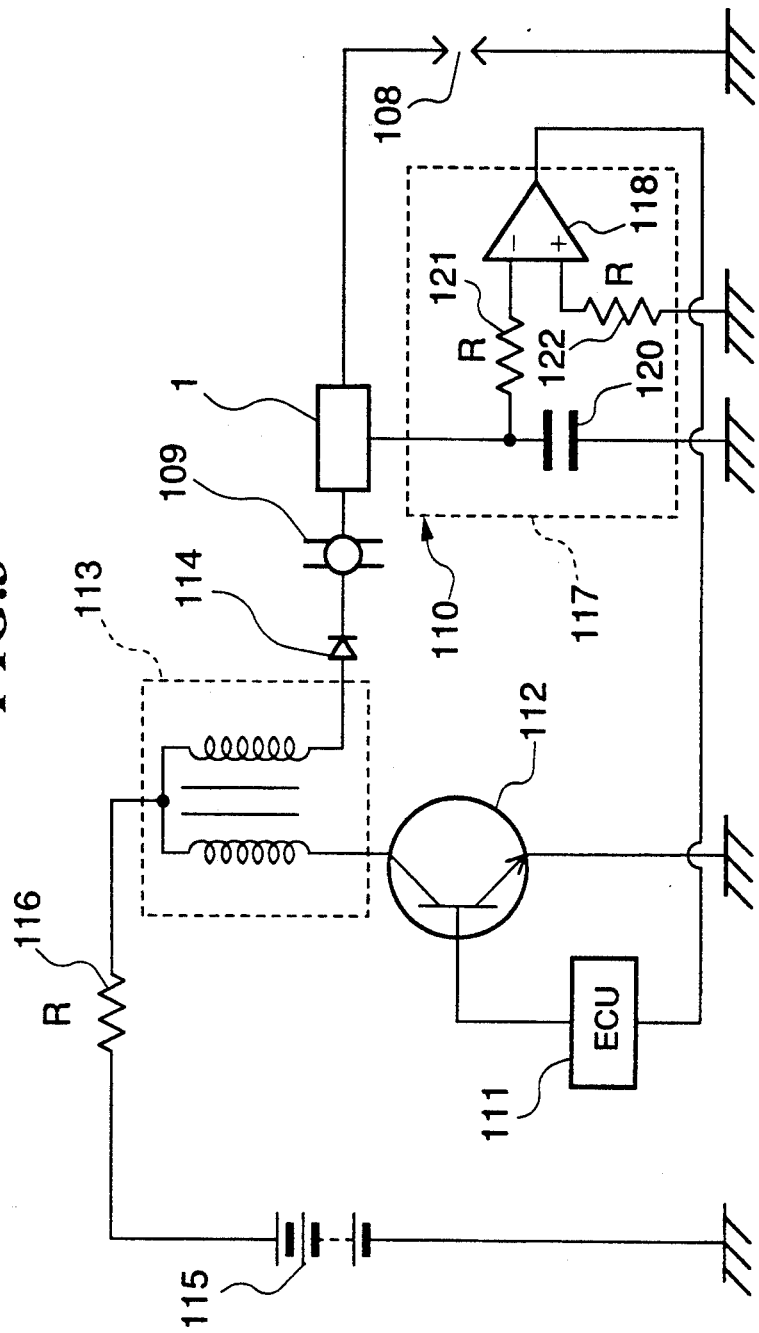
FIG. 5 is a circuit diagram of the electrical connection of the ignition system.

The sensor 1 of the sparking voltage detecting device constructed as above is incorporated in the ignition system of the engine, as shown in FIGS. 4 and 5. In the figures, the high-tension cords 4 fitted through the respective through holes 3 of the main body 2 of the sensor 1 are connected at one ends thereof to respective spark plugs 108 and at the other ends to an output of a distributor 109. The lead wire 7 extending from the main body 2 is connected to an input of the voltage detecting unit 110. The voltage detecting unit 110 and the sensor 1 cooperate to form the sparking voltage detecting device. An output of the voltage detecting unit 110 is connected to an input of an electronic control unit (ECU) 111. An output of the ECU 111 is connected to the input of the distributor through an igniter 112, an ignition coil 113, and a diode 114. In FIG. 5, reference numeral 115 designates a power supply (battery), a positive terminal of which is connected to the ignition coil 113 through a resistance 116. The voltage detecting unit 110 has a determining circuit 117 which determines whether the sparking voltage is normal or not. The circuit 117 is formed by an operational amplifier 118, a capacitor 120, and resistances 121 and 122.

The operation of the sparking voltage detecting device constructed as above will now be described:

The ECU 111 supplies an ignition command signal to the igniter 112 at a timing determined by the rotational speed of the engine, etc. The igniter 112 cuts off primary current flowing in the ignition coil in response to the ignition command signal to cause generation of high voltage on the secondary side of the ignition coil 113, which voltage is distributed by the distributor 109 to be applied to the spark plugs of the engine cylinders through the respective high-tension cords 4.

The above high voltage, i.e. sparking voltage is detected by the sensor 1, an output voltage signal of which is supplied to the voltage detecting unit 110 where the determining circuit 117 compares the sparking voltage with a predetermined voltage value to determine whether the sparking voltage is normal or not, and supplies a determination signal to the ECU 111 as information for setting the ignition timing.

The above described operation is substantially identical with that of a conventional ignition system.

In the present embodiment, as described hereinbefore, the conductive member 6 is embedded in the main body 2 formed of an insulating material at a location radially outward of the through holes 3 and spaced from the outer peripheral surfaces of the high-tension cords 4 by a predetermined distance, and the high-tension cords 4 are supportedly fitted through the through holes 3. As a result, the conductive member 6 is firmly held in spaced relation to the high-tension cords 4 with an accurate predetermined clearance between the members 4, 6. Therefore, it is possible to prevent the conductive member 6 from being adversely influenced by corona discharge from the high-tension cords 4 so that the conductive member 6 has a prolonged life and can provide a stable and accurate detected voltage output.

Further, since the high-tension cords 4 are fitted through the through holes 3 in a liquidtight manner, the electrostatic capacity of the conductive member 6 is not liable to be affected by vibrations, humidity (moisture), etc., thereby enabling to dispense with the use of a protective circuit for coping with a leak of high voltage. Moreover, since the diameter of the through holes 3 is set at a larger value than the outer diameter of the high-tension cords 4 and the water-proofing annular lips 5 formed on the inner peripheral surface of each through hole 3 serve to positively maintain liquidtightness between the through hole and the high-tension cord 4 while facilitating mounting of the high-tension cord 4 through the through hole 3.

Besides, since the conductive member 6 has its portions 6a combined together, only a single lead wire 7 can be used to pick up the voltage signal, enabling to design the sensor 1 compact in size and light in weight. In addition, since the lead wire 7 is formed by a shielding wire, the sparking voltage detecting device has improved stability against external disturbances such as radio interference and noise.

Next, second to thirteenth embodiments of the invention will be described. In the following description, elements and parts not referred to therein are substantially identical in construction and arrangement with those in FIGS. 1 to 5, referred to above, and therefore designated by identical reference numerals, description of which is omitted.

Figure 6:
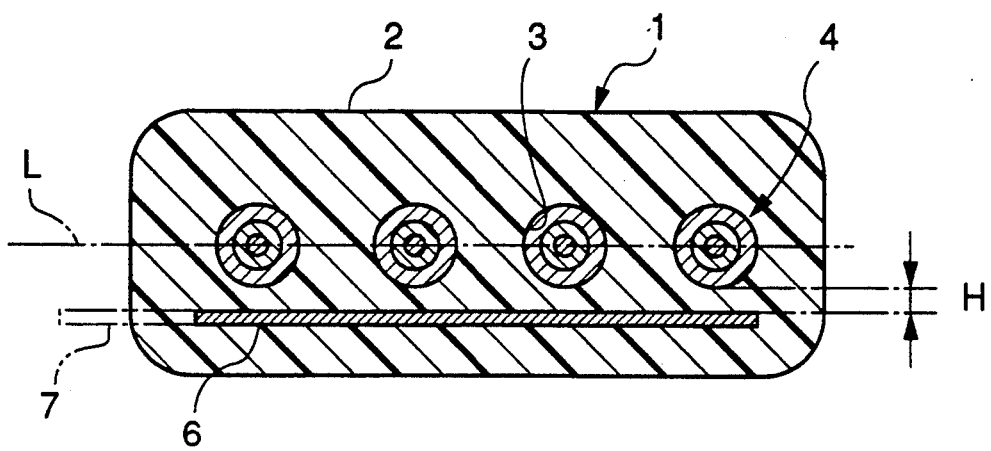
FIG. 6 is a longitudinal sectional view of a sensor of a sparking voltage detecting device according to a second embodiment of the invention.

FIG. 6 shows a second embodiment of the invention. According to the second embodiment, a single conductive member 6 in the form of a flat plate is embedded in the main body 2 and arranged at one lateral side of the block or main body 2 with respect to the line L extending through the centers of the through holes 3. The conductive member 6 has a length at least equal to the length of the row of the through holes 3. One end of the lead wire 7 is connected to one end of the conductive member 6.

Figure 7:
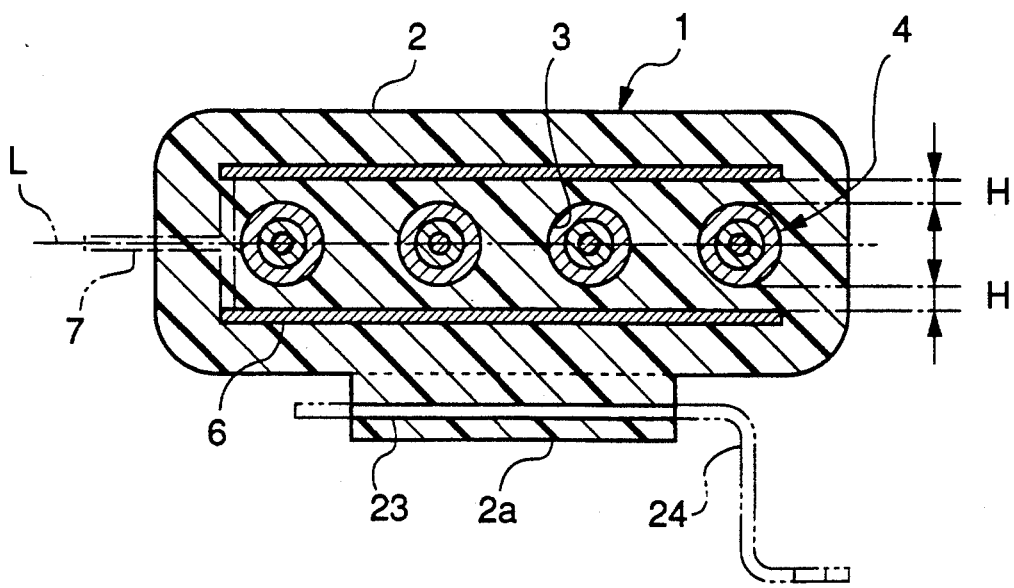
FIG. 7 is a longitudinal sectional view of a sensor of a sparking voltage detecting device according to a third embodiment of the invention.

FIG. 7 shows a third embodiment of the invention. According to the third embodiment, a pair of conductive members 6 and 6 in the form of a flat plate similar to the conductive member 6 of the second embodiment described above are symmetrically arranged at opposite lateral sides of the main body 2 with respect to the line L extending through the centers of the through holes 3. One end of the lead wire 7 is connected to one ends of the conductive members 6,6. The main body 2 has a projection 2a extending integrally from a lower side surface thereof and formed therein with a slit 23 in which a fitting bracket member 24 is rigidly fitted for mounting the sensor 1 on a suitable portion of the engine.

Figure 8:
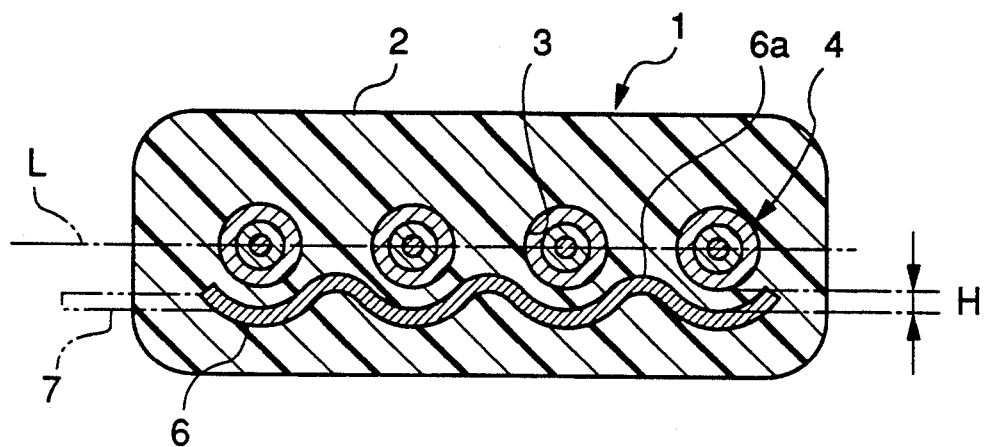
FIG. 8 is a longitudinal sectional view of a sensor of a sparking voltage detecting device according to a fourth embodiment of the invention.

FIG. 8 shows a fourth embodiment of the invention. According to the fourth embodiment, a single conductive member 6 in the form of a corrugated or waved plate is embedded in the main body 2 and arranged at one lateral side of the block or main body 2 with respect to the line L extending through the centers of the through holes 3. The conductive member 6 has a length at least equal to the length of the row of the through holes 3. One end of the lead wire 7 is connected to one end of the conductive member 6. The conductive member 6 has concave portions 6a facing the respective through holes 3 in concentricity thereto.

Figure 9:
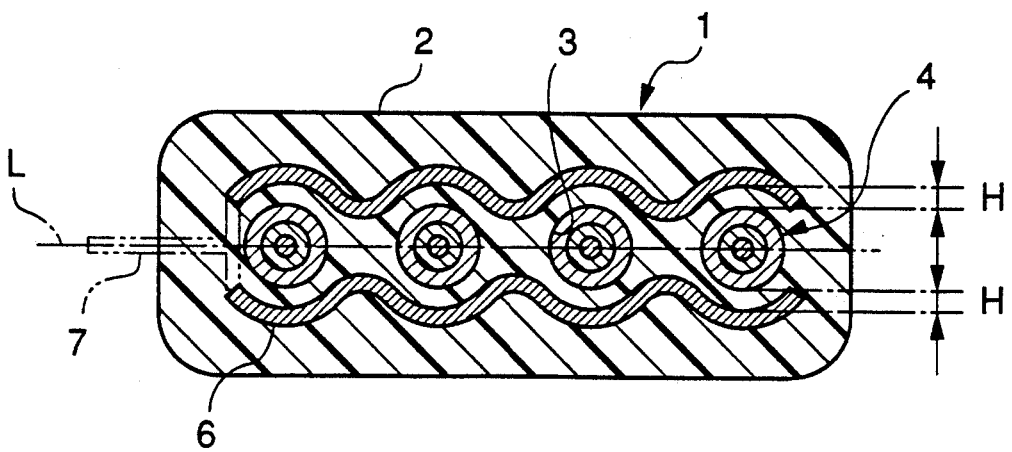
FIG. 9 is a longitudinal sectional view of a sensor of a sparking voltage detecting device according to a fifth embodiment of the invention.

FIG. 9 shows a fifth embodiment of the invention. According to the fifth embodiment, a pair of conductive members 6 and 6 in the form of a corrugated plate similar to the conductive member 6 of the fourth embodiment described above are symmetrically arranged at opposite lateral sides of the main body 2 with respect to the line L extending through the centers of the through holes 3. One of the lead wire 7 is connected to one ends of the conductive members 6, 6.

Figure 10:
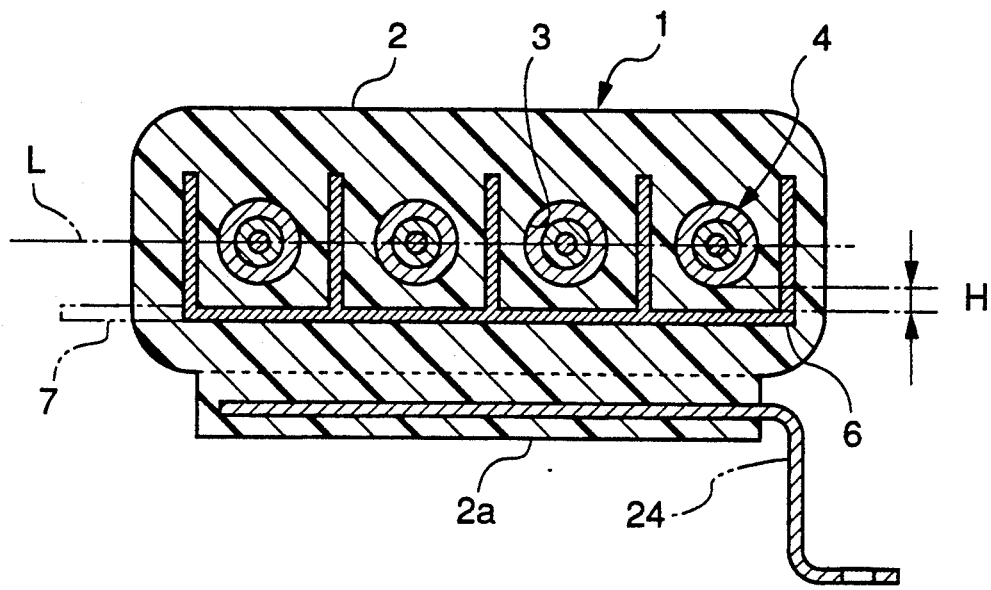
FIG. 10 is a longitudinal sectional view of a sensor of a sparking voltage detecting device according to a sixth embodiment of the invention.

FIG. 10 shows a sixth embodiment of the invention. A conductive member 6 according to the sixth embodiment has a plurality of, e.g. five, walls extending integrally from a flat platelike base portion and defining separate compartments having a generally U-shaped configuration. The through holes 3 are partly enclosed by the respective compartments. Further, like the third embodiment of FIG. 7, the main body 2 has an integral projection 2a in which a fitting bracket member 24 is fitted.

Figure 11:
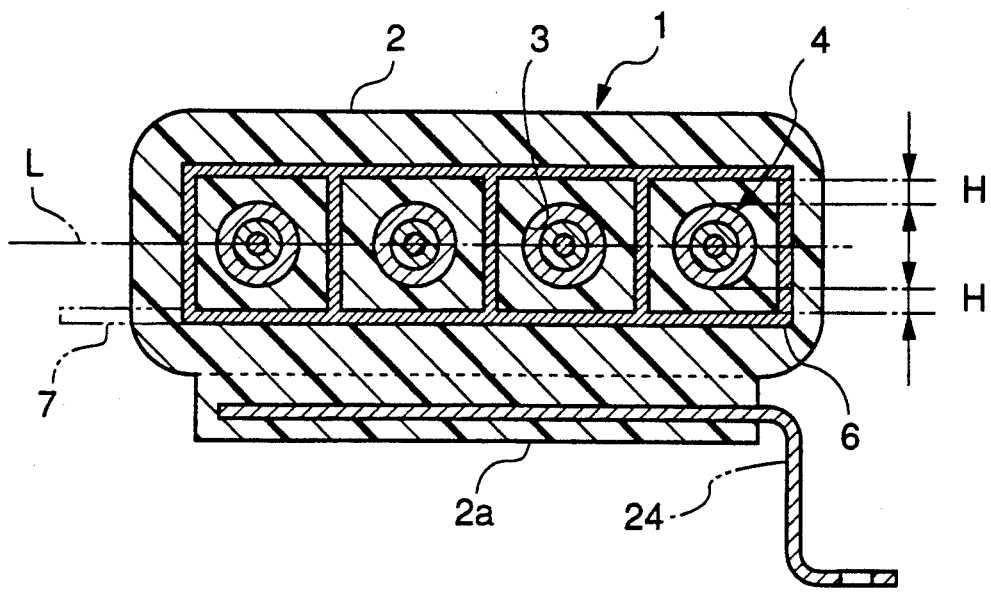
FIG. 11 is a longitudinal sectional view of a sensor of a sparking voltage detecting device according to a seventh embodiment of the invention.

FIG. 11 shows a seventh embodiment of the invention. A conductive member 6 according to the seventh embodiment is in the form of a four-sided hollow body having a plurality of, e.g. five, partition walls extending integrally between opposite flat platelike wall portions and defining separate compartments having a space of a square cross section. The through holes 3 are enclosed by the respective compartments. Further, like the third embodiment of FIG. 7, the main body 2 has an integral projection 2a in which a fitting bracket member 24 is fitted.

Figure 12:
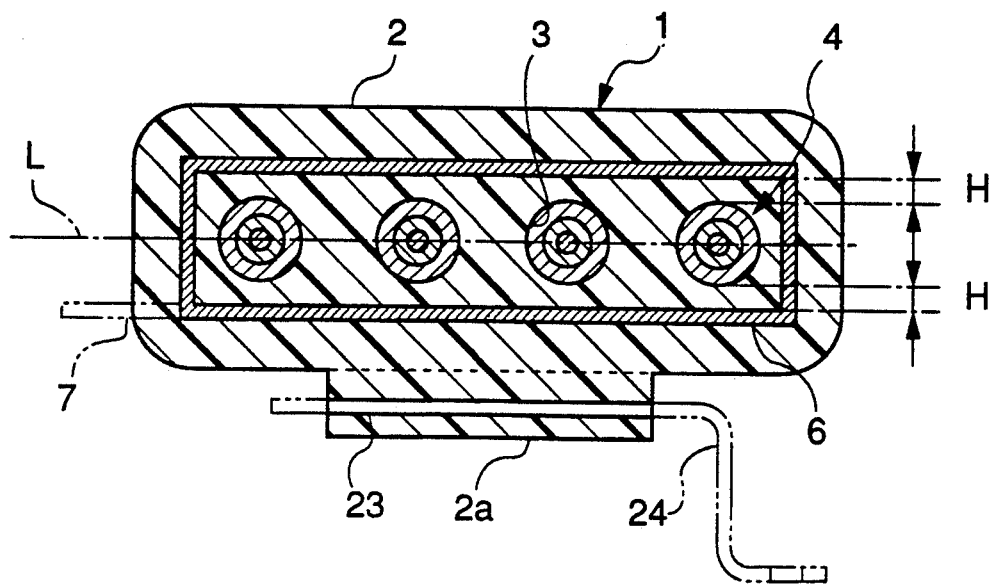
FIG. 12 is a longitudinal sectional view of a sensor of a sparking voltage detecting device according to an eighth embodiment of the invention.

FIG. 12 shows an eighth embodiment of the invention. A conductive member 6 according to the eighth embodiment is in the form of a four-sided hollow body having an oblong or rectangular cross section but without partition walls like those of the preceding embodiment. The conductive member 6 defines therein a single large space enclosing all the through holes 3.

Of the above described first to eighth embodiments, the embodiments having a single conductive member 6 arranged at one lateral side of the main body 2 with respect to the line L extending through the centers of the through holes 3 are advantageous in that the whole sensor 1 can be designed compact in size. On the other hand, the embodiments having a pair of conductive members 6, 6 symmetrically arranged at opposite lateral sides of the main body 2 with respect to the line L extending through the centers of the through holes 3, or a conductive member 6 having a hollow body enclosing the through holes 3 are advantageous in that the sensor 1 can detect sparking voltage with higher accuracy and provide a stable detected voltage output. Further, as in the sixth and seventh embodiments, if the conductive member 6 has an increased surface area facing the high-tension cords 4 in spaced relation thereto by a predetermined distance, the sparking voltage can be detected with still higher accuracy, since the electrostatic capacity is increased.

Figure 13:
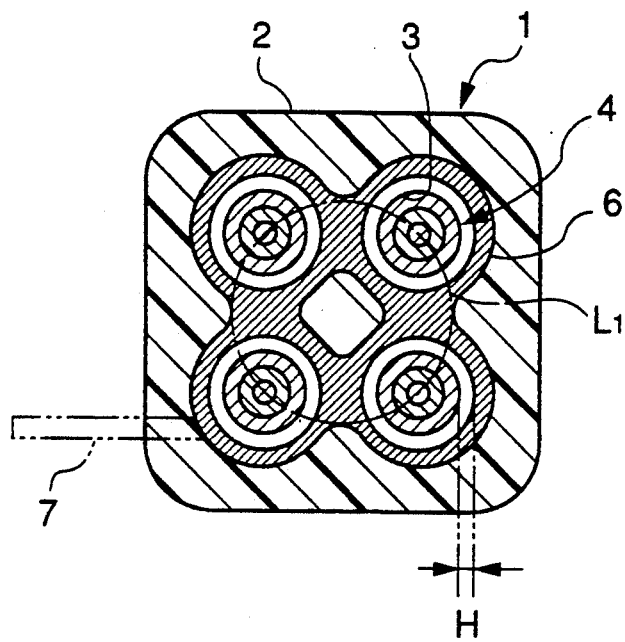
FIG. 13 is a longitudinal sectional view of a sensor of a sparking voltage detecting device according to a ninth embodiment of the invention.

FIG. 13 shows a ninth embodiment of the invention. According to the ninth embodiment, a plurality of, e.g. four, through holes 3 are formed in the main body 2 with their centers located along a circle L1 formed about a central portion of the main body 2 having a generally square cross section, and the through holes 3 are arranged at circumferentially equal intervals. The conductive member 6 has a plurality of, e.g. four, cylindrical portions 6a enclosing the respective through holes 3 in concentricity thereto.

Figure 14:
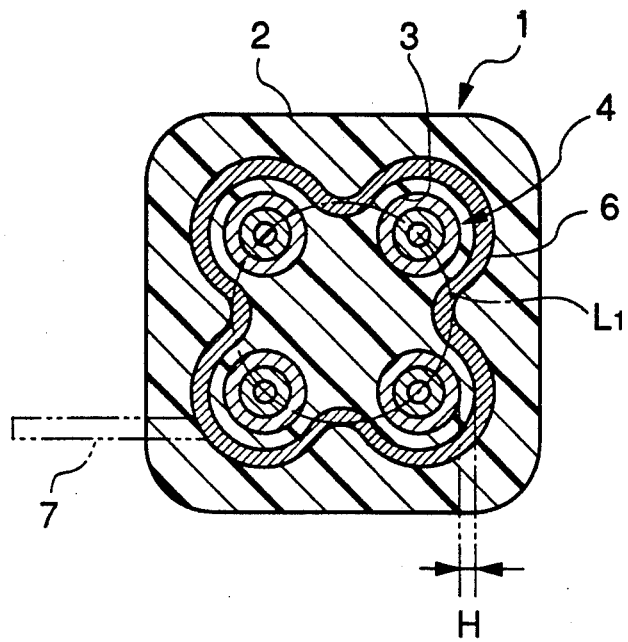
FIG. 14 is a longitudinal sectional view of a sensor of a sparking voltage detecting device according to a tenth embodiment of the invention.

FIG. 14 shows a tenth embodiment of the invention. A conductive member 6 according to the tenth embodiment is in the form of a hollow tube having a generally square cross section and encloses all the through holes 3 arranged similarly to the ninth embodiment of FIG. 13, with four arcuately curved corners thereof facing the respective through holes 3.

Figure 15:
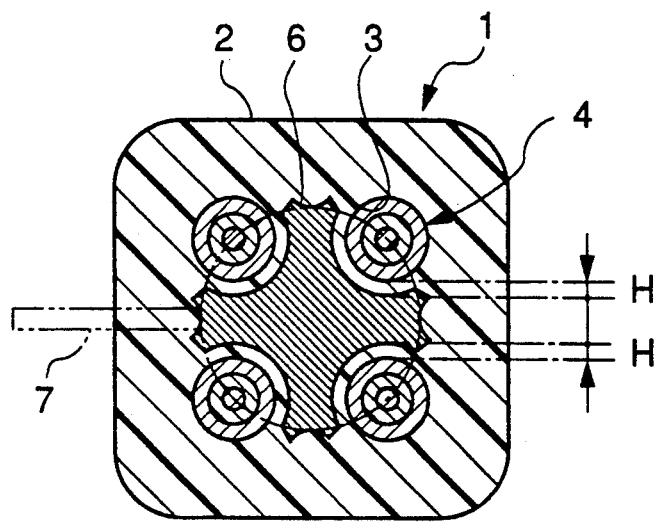
FIG. 15 is a longitudinal sectional view of a sensor of a sparking voltage detecting device according to an eleventh embodiment of the invention.

FIG. 15 shows an eleventh embodiment of the invention. A conductive member 6 according to the eleventh embodiment is formed by a generally cruciform element having four arms and arranged at a central portion of an area defined between the through holes 3 arranged similarly to the ninth embodiment of FIG. 13. The conductive member 6 has four wall portions having arcuate surfaces facing the respective through holes 3. One end of the lead wire 7 is connected to one arm of the conductive member 6.

Figure 16:
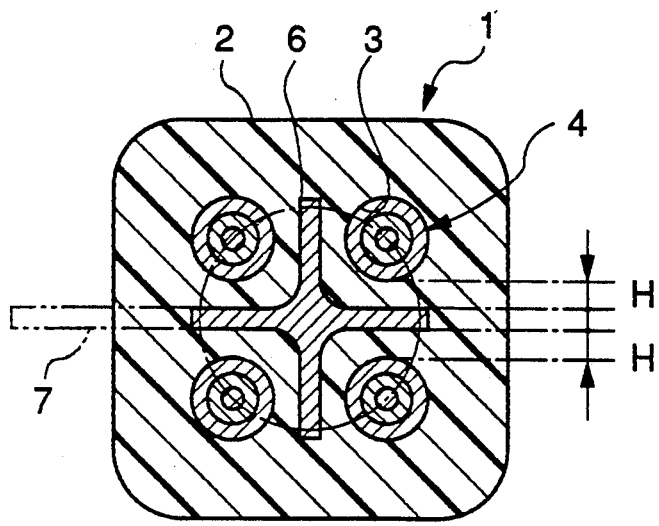
FIG. 16 is a longitudinal sectional view of a sensor of a sparking voltage detecting device according to a twelfth embodiment of the invention.

FIG. 16 shows a twelfth embodiment of the invention. A conductive member 6 according to the twelfth embodiment is formed by a generally cruciform element having four arms but generally more slender than the conductive member 6 of the preceding embodiment, and arranged at a central portion of an area defined between the through holes 3 arranged similarly to the ninth embodiment of FIG. 13. The conductive member 6 has four wall portions having angled surfaces facing the respective through holes 3. One end of the lead wire 7 is connected to one arm of the conductive member 6.

Figure 17:
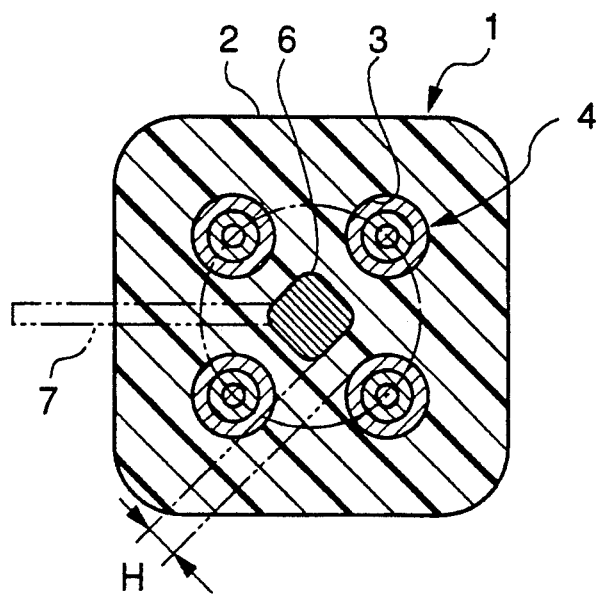
FIG. 17 is a longitudinal sectional view of a sensor of a sparking voltage detecting device according to a thirteenth embodiment of the invention.

FIG. 17 shows a thirteenth embodiment of the invention. A conductive member 6 according to the thirteenth embodiment is in the form of a rod having a generally square cross section and arranged at a central portion of an area defined between the through holes 3 arranged similarly to the ninth embodiment of FIG. 13. One end of the lead wire 7 is connected to one corner of the conductive member 6.

According to the ninth to thirteenth embodiments of FIGS. 13 to 17, described above, the through holes 3 are arranged with their centers located along the circle L1 formed about a central portion of the main body having a generally square cross section, the through holes 3 being arranged at circumferentially equal intervals. As a result, the whole sensor 1 can be designed more compact in size, as compared with the sixth to twelfth embodiments.

Next, fourteenth to twenty-sixth embodiments of the invention will be described. These embodiments are distinguished from the above described embodiments in that a shielding member or members are embedded in the main body 2 at a location outward of the conductive member 6 radially of the through holes 3, i.e. at a side of the conductive member 6 remote from the high-tension cords 4 (hereinafter expressed as "radially outward of the conductive member 6"). In the following description, elements and parts not referred to therein are substantially identical in construction and arrangement with those of the first embodiment shown in FIGS. 1 to 5, and therefore designated by identical reference numeral, description of which is omitted.

Figure 18:
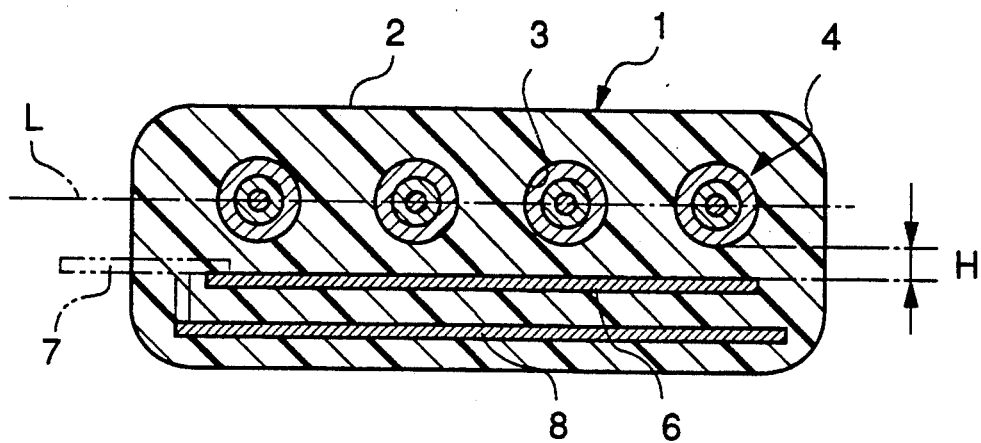
FIG. 18 is a longitudinal sectional view of a sensor of a sparking voltage detecting device according to a fourteenth embodiment of the invention.
Figure 19:
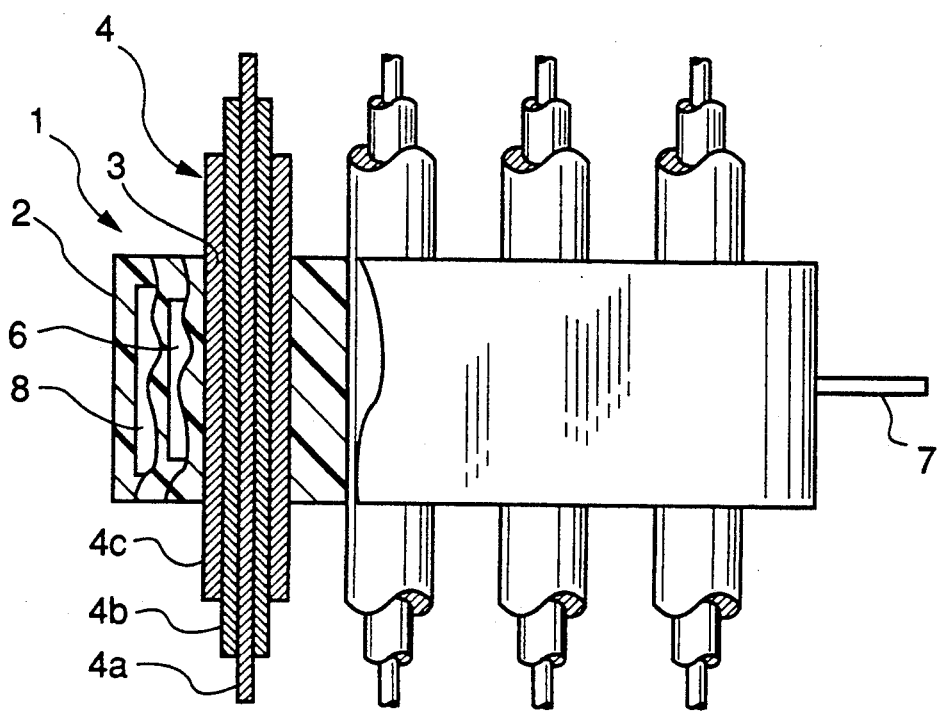
FIG. 19 is a fragmentary enlarged view of a portion of the sensor encircled in FIG. 18.

FIGS. 18 and 19 show a fourteenth embodiment of the invention. The fourteenth embodiment is substantially identical in arrangement with the second embodiment of FIG. 6 described hereinbefore, except that a shielding member 8 is embedded in the main body 2 at a side radially outward of the conductive member 6. The shielding member 8 is in the form of a flat plate and is formed of a conductive material. The shielding member 8 extends parallel with the conductive member 6 in spaced relation thereto at a predetermined distance therefrom. One end of the lead wire 7 formed of a shielding material is connected to one end of the shielding member 8 and the conductive member 6.

The lead wire 7 is previously connected to the shielding member 8 as well as to the conductive member 6, and then the members 6, 8 are placed into a mold for forming the main body 2, to be molded together with the main body 2.

According to the fourteenth embodiment constructed as above, the shielding member 8 arranged at a side radially outward of the conductive member 6 acts to effectively prevent external disturbances such as radio interference and noise from badly affecting the detecting accuracy of the sensor 1.

Figure 20:
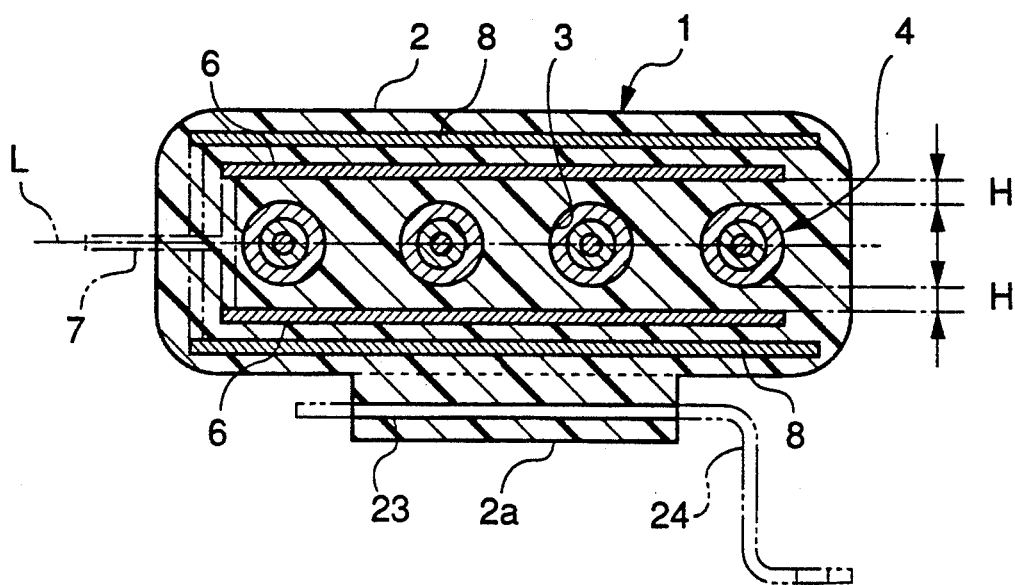
FIG. 20 is a longitudinal sectional view of a sensor of a sparking voltage detecting device according to a fifteenth embodiment of the invention.

FIG. 20 shows a fifteenth embodiment of the invention. The fifteenth embodiment is substantially identical in arrangement with the third embodiment of FIG. 7, described hereinbefore, except that a pair of shielding members 8 and 8 are embedded in the main body 2 at opposite sides radially outward of the respective conductive members 6, 6.

Figure 21:
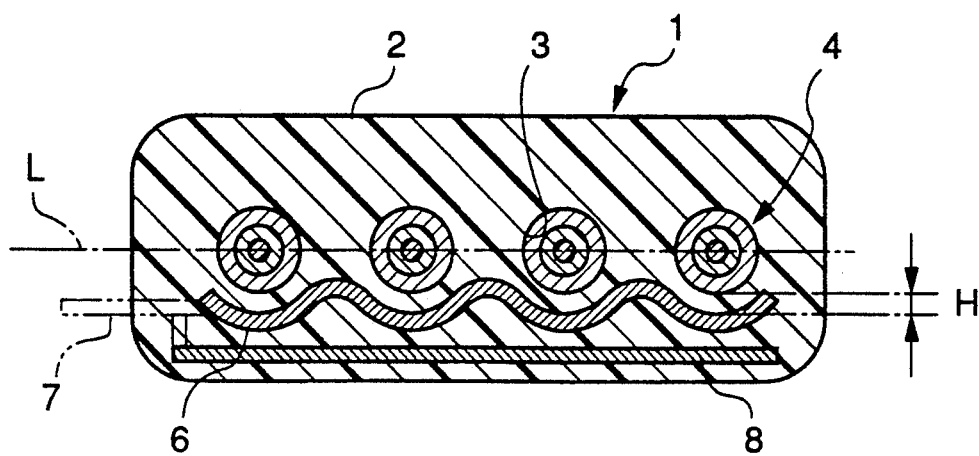
FIG. 21 is a longitudinal sectional view of a sensor of a sparking voltage detecting device according to a sixteenth embodiment of the invention.

FIG. 21 shows a sixteenth embodiment of the invention. The sixteenth embodiment is substantially identical in arrangement with the fourth embodiment of FIG. 8, described hereinbefore, except that a shielding member 8 in the form of a flat plate is embedded in the main body 2 at a side radially outward of the conductive member 6.

Figure 22:
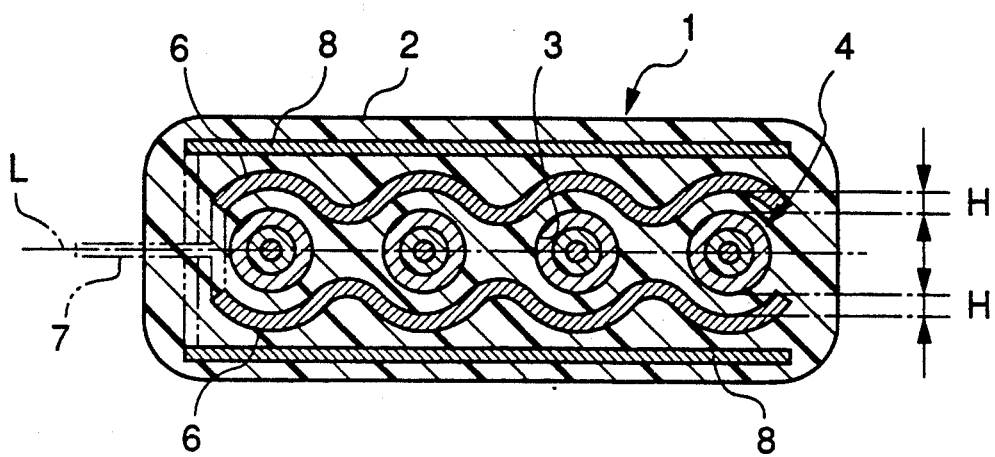
FIG. 22 is a longitudinal sectional view of a sensor of a sparking voltage detecting device according to a seventeenth embodiment of the invention.

FIG. 22 shows a seventeenth embodiment of the invention. The seventeenth embodiment is substantially identical in arrangement with the fifth embodiment of FIG. 9, described hereinbefore, except that a pair of shielding member 8 and 8 are embedded in the main body 2 at opposite sides radially outward of the respective conductive members 6, 6. One end of the lead wire 7 is connected to one ends of the conductive members 6, 6, as well as to one ends of the shielding members 8, 8.

Figure 23:
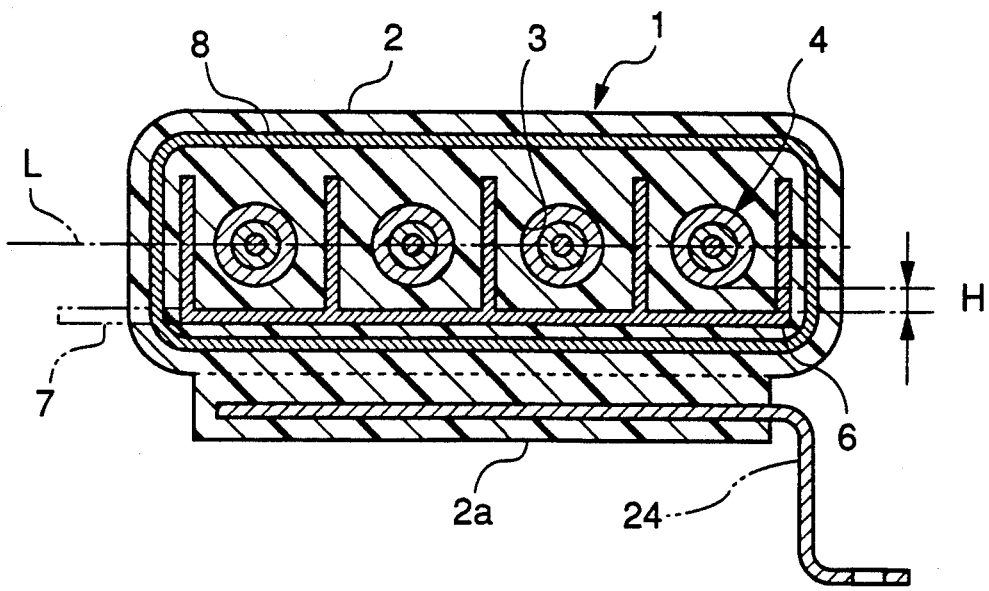
FIG. 23 is a longitudinal sectional view of a sensor of a sparking voltage detecting device according to an eighteenth embodiment of the invention.

FIG. 23 shows an eighteenth embodiment of the invention. The eighteenth embodiment is substantially identical in arrangement with the sixth embodiment of FIG. 10, described hereinbefore, except that a shielding member 8 in the form of a hollow tube having an oblong or generally rectangular cross section is embedded in the main body 2 at a peripheral portion outward of the conductive member 6 such that it encloses all the through holes 3 and the conductive member 6.

Figure 24:
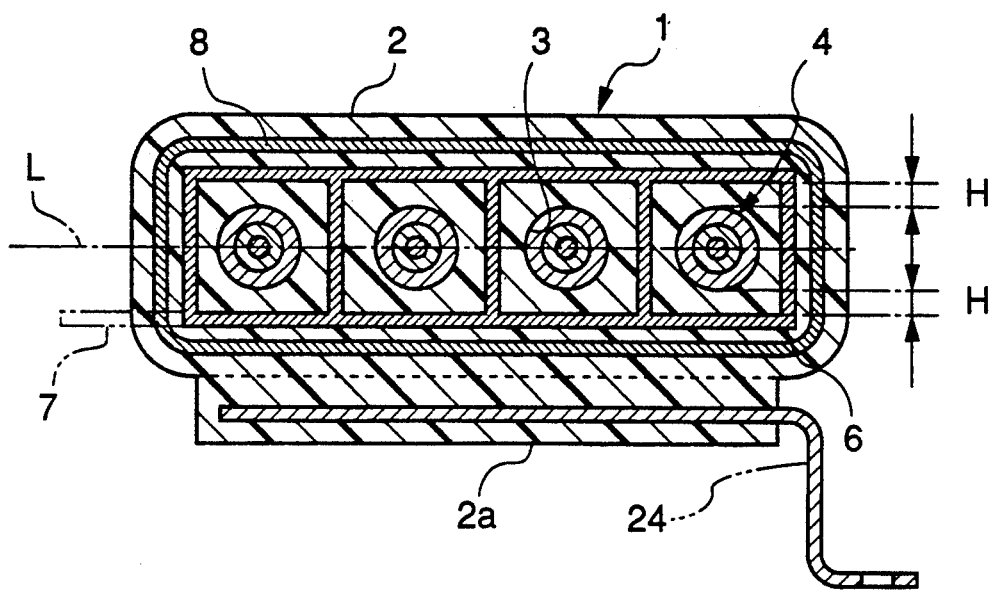
FIG. 24 is a longitudinal sectional view of a sensor of a sparking voltage detecting device according to a nineteenth embodiment of the invention.

FIG. 24 shows a nineteenth embodiment of the invention. The nineteenth embodiment is substantially identical with the seventh embodiment of FIG. 11, described hereinbefore, except that a shielding member 8 in the form of a hollow tube having an oblong or generally rectangular cross section, similarly to the eighteenth embodiment of FIG. 23, described above, is embedded in the main body 2 at a peripheral portion outward of the conductive member 6 such that it encloses all the through holes 3 and the conductive member 6.

Figure 25:
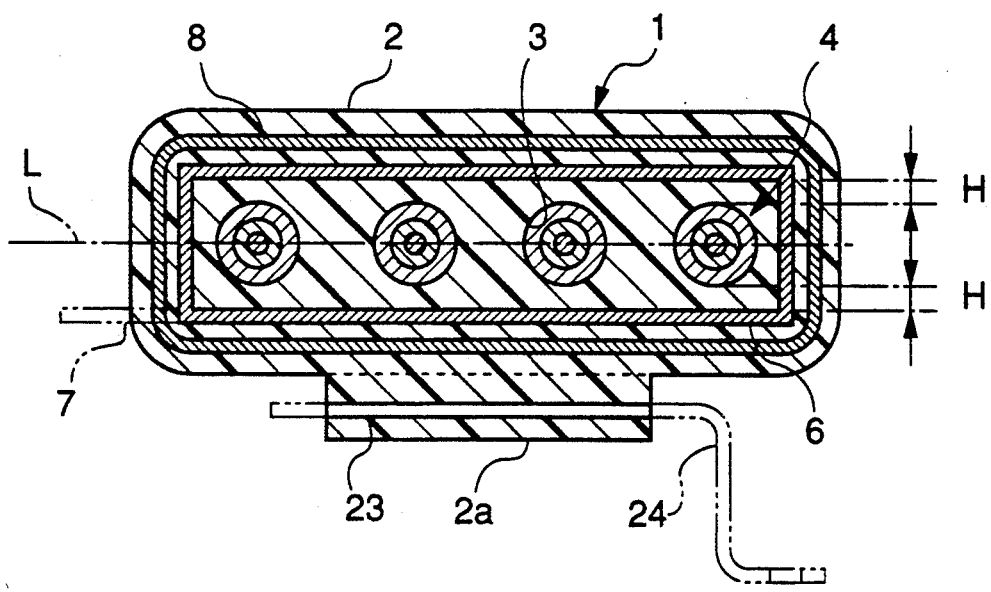
FIG. 25 is a longitudinal sectional view of a sensor of a sparking voltage detecting device according to a twentieth embodiment of the invention.

FIG. 25 shows a twentieth embodiment of the invention. The twentieth embodiment is substantially identical in arrangement with the eighth embodiment of FIG. 12, described hereinbefore, except that a shielding member 8 in the form of a hollow tube having an oblong or generally rectangular cross section, similarly to the eighteenth embodiment of FIG. 23, described above, is embedded in the main body 2 at a peripheral portion outward of the conductive member 6 such that it encloses all the through holes 3 and the conductive member 6.

Figure 26:
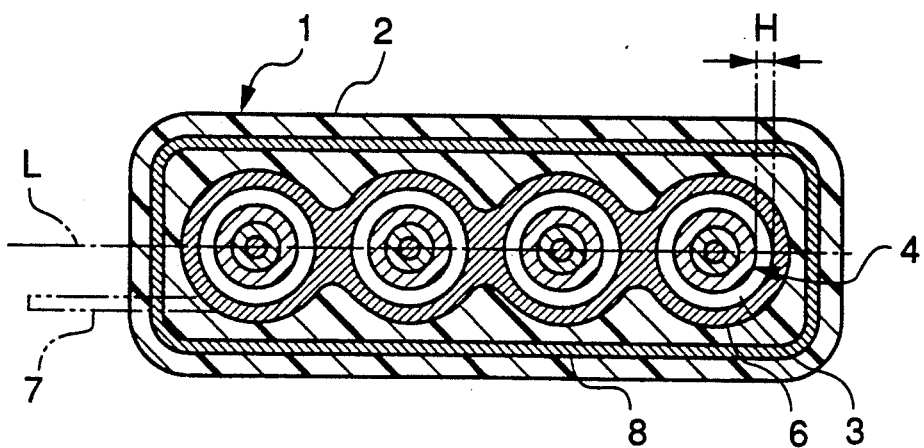
FIG. 26 is a longitudinal sectional view of a sensor of a sparking voltage detecting device according to a twenty-first embodiment of the invention.
Figure 27:
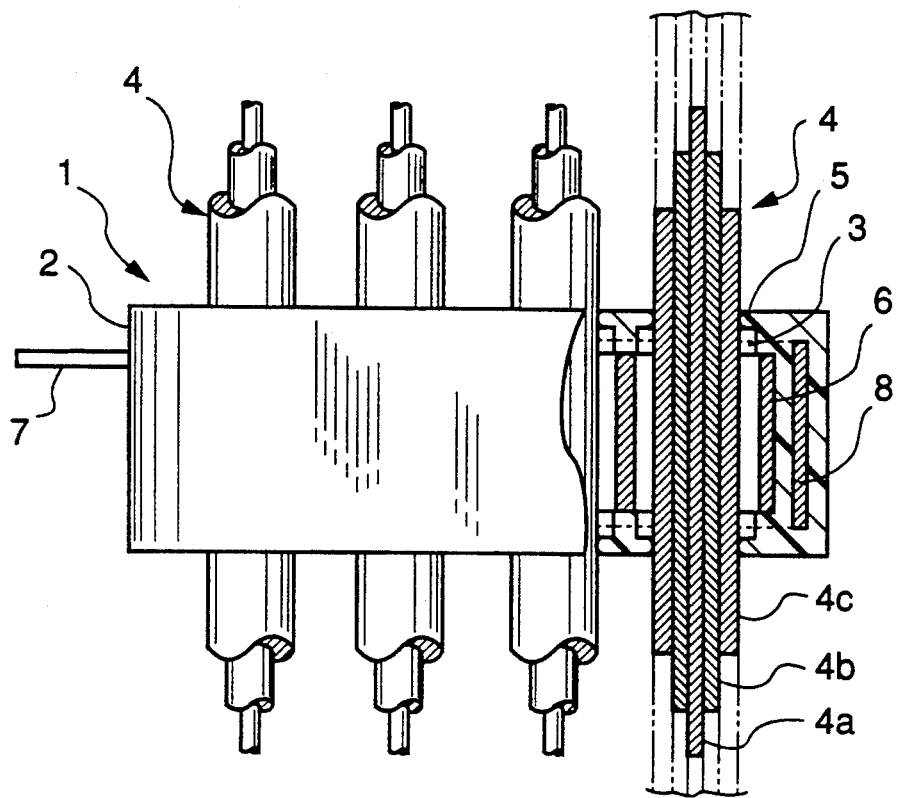
FIG. 27 is a top plan view of the sensor of FIG. 26.

FIGS. 26 and 27 show a twenty-first embodiment of the invention. The twenty-first embodiment is substantially identical in arrangement with the first embodiment of FIG. 1, described hereinbefore, except that a shielding member 8 in the form of a hollow tube having an oblong or generally rectangular cross section, similarly to the eighteenth embodiment of FIG. 23, described above, is embedded in the main body 2 at a peripheral portion radially outward of the conductive member 6 such that it encloses all the through holes 3 and the conductive member 6. One end of the lead wire 7 is connected to one ends of the conductive member 6 and the shielding member 8 at one or left axial end of the main body, as viewed in FIGS. 26 and 27

Figure 28:
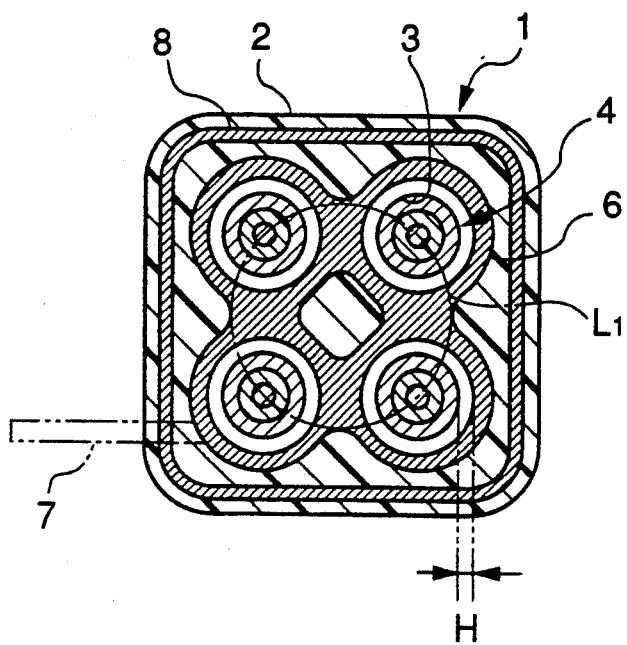
FIG. 28 is a longitudinal sectional view of a sensor of a sparking voltage detecting device according to a twenty-second embodiment of the invention.

FIG. 28 shows a twenty-second embodiment of the invention. The twenty-second embodiment is substantially identical in arrangement with the ninth embodiment of FIG. 13, described hereinbefore, except that a shielding member 8 in the form of a hollow tube having a generally square cross section, is embedded in the main body 2 at a peripheral portion radially outward of the conductive member 6 such that it encloses all the through holes 3 and the conductive member 6. One end of the lead wire 7 is connected to the conductive member 6 and the shielding member 8.

Figure 29:
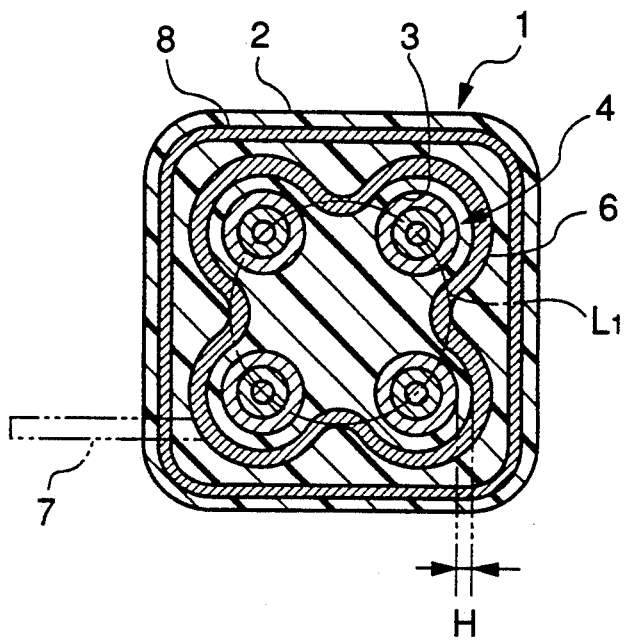
FIG. 29 is a longitudinal sectional view of a sensor of a sparking voltage detecting device according to a twenty-third embodiment of the invention.

FIG. 29 shows a twenty-third embodiment of the invention. The twenty-third embodiment is substantially identical in arrangement with the tenth embodiment of FIG. 14, described hereinbefore, except that a shielding member 8 in the form of a hollow tube having a generally square cross section, similarly to the twenty-second embodiment of FIG. 28, described above, is embedded in the main body 2 at a peripheral portion radially outward of the conductive member 6 such that it encloses all the through holes 3 and the conductive member 6. One end of the lead wire 7 is connected to the conductive member 6 and the shielding member 8.

Figure 30:
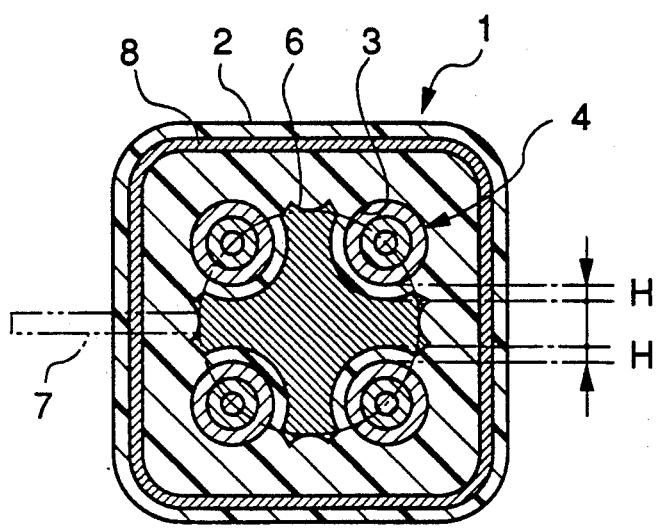
FIG. 30 is a longitudinal sectional view of a sensor of a sparking voltage detecting device according to a twenty-fourth embodiment of the invention.

FIG. 30 shows a twenty-fourth embodiment of the invention. The twenty-fourth embodiment is substantially identical in arrangement with the eleventh embodiment of FIG. 15, described hereinbefore, except that a shielding member 8 in the form of a hollow tube having a generally square cross section, similarly to the twenty-second embodiment of FIG. 28, described above, is embedded in the main body 2 at a peripheral portion radially outward of the conductive member 6 such that it encloses all the through holes 3 and the conductive member 6. One end of the lead wire 7 is connected to the conductive member 6 and the shielding member 8.

Figure 31:
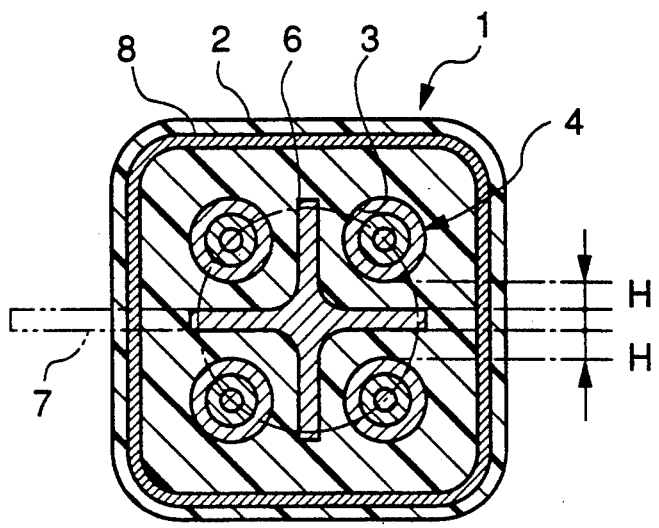
FIG. 31 is a longitudinal sectional view of a sensor of a sparking voltage detecting device according to a twenty-fifth embodiment of the invention.

FIG. 31 shows a twenty-fifth embodiment of the invention. The twenty-fifth embodiment is substantially identical in arrangement with the twelfth embodiment of FIG. 16, described hereinbefore, except that a shielding member 8 in the form of a hollow tube having a generally square cross section, similarly to the twenty-second embodiment of FIG. 28, described above, is embedded in the main body 2 at a peripheral portion radially outward of the conductive member 6 such that it encloses all the through holes 3 and the conductive member 6. One end of the lead wire 7 is connected to the conductive member 6 and the shielding member 8.

Figure 32:
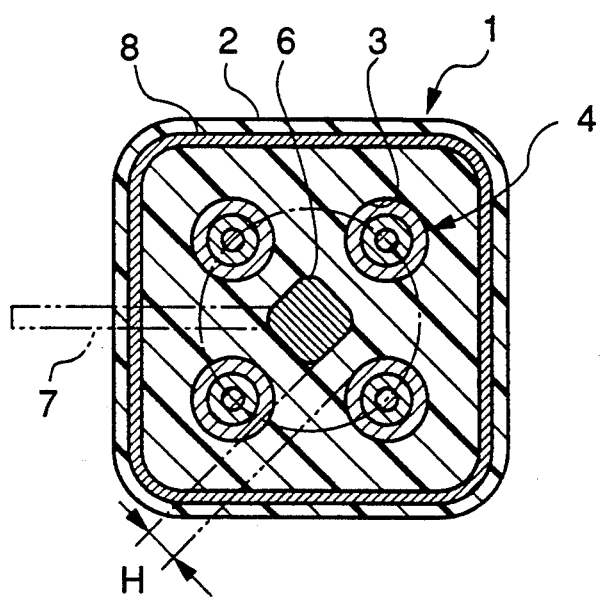
FIG. 32 is a longitudinal sectional view of a sensor of a sparking voltage detecting device according to a twenty-sixth embodiment of the invention.

FIG. 32 shows a twenty-sixth embodiment of the invention. The twenty-sixth embodiment is substantially identical with the thirteenth embodiment of FIG. 17, described hereinbefore, except that a shielding member 8 in the form of a hollow tube having a generally square cross section, similarly to the twenty-second embodiment of FIG. 28, described above, is embedded in the main body 2 at a peripheral portion radially outward of the conductive member 6 such that it encloses all the through holes 3 and the conductive member 6. One end of the lead wire 7 is connected to the conductive member 6 and the shielding member 8.

According to the fourteenth to twenty-sixth embodiments described above, a shielding member is additionally arranged at a location radially outward of the conductive member, as compared with the arrangements of the first to thirteenth embodiments previously described. As a result, these embodiments are much less susceptible to the influence of radio interference from the outside, in addition to the effects of the first to thirteenth embodiments described hereinbefore.

Then, twenty-seventh to forty embodiments of the invention will be described. These embodiments are distinguished from the first to thirteenth embodiments in that an insulating member or members formed of ceramics are interposed between the through holes and the conductive member or members. In the following description, elements and parts not referred to therein are substantially identical with those of the first embodiment shown in FIGS. 1 to 5, described previously, and therefore designated by identical reference numerals, description of which is omitted.

Figure 33:
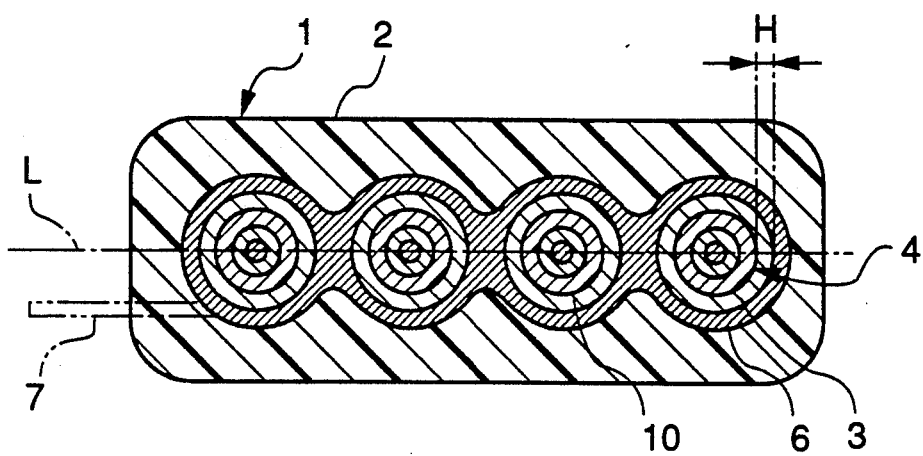
FIG. 33 is a longitudinal sectional view of a sensor of a sparking voltage detecting device according to a twenty-seventh embodiment of the invention
Figure 34:
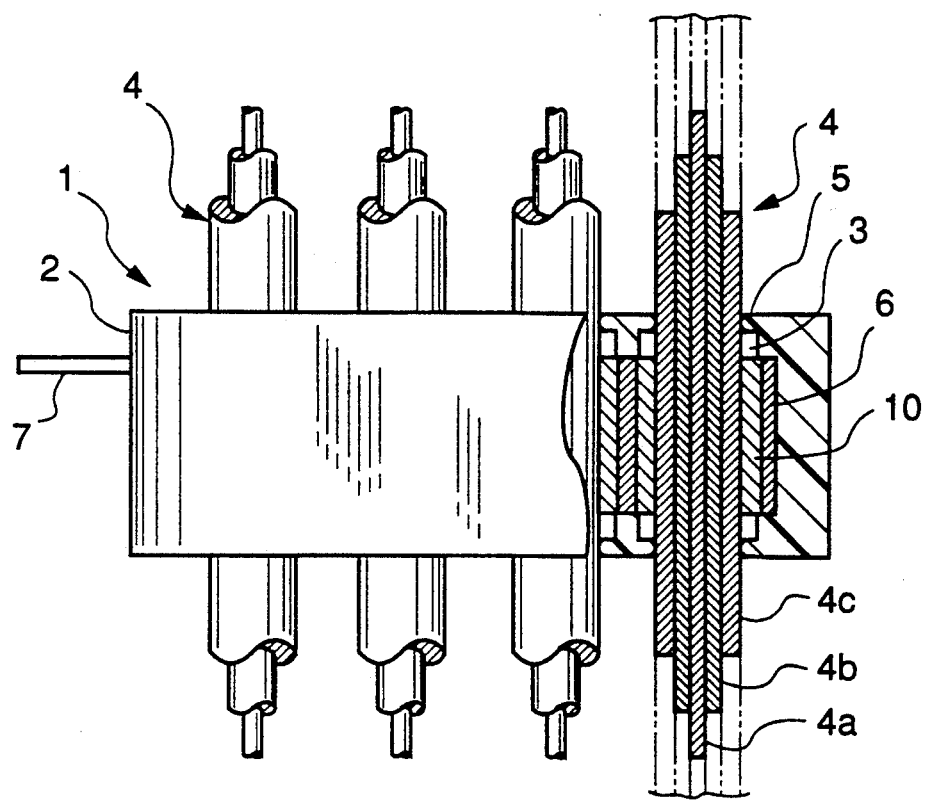
FIG. 34 is a top plan view of the sensor of FIG. 33.

FIGS. 33 and 34 show a twenty-seventh embodiment of the invention. The twenty-seventh embodiment is substantially identical in arrangement with the first embodiment of FIG. 1, except that insulating members 10 formed of ceramics are interposed between the through holes 3 and the conductive member 6 (actually, the insulating members 10 are fitted in annular spaces defined between the through holes 3 and the conductive member 6, in the illustrated embodiment). The insulating members 10 are cylindrical in shape and each fitted in a gap between the high-tension cord 4 and the conductive member 6. Also the lead wire 7 is previously connected to the insulating members 10 as well as to the conductive member 6, and then the insulating members 10 and the conductive member 6 are placed into a mold for forming the main body 2, to be molded together with the main body 2.

By thus interposing the ceramic insulating members 10 between the through holes 3 and the conductive member 6, in addition to the effects of the first embodiment described hereinbefore, the output from the sensor 1 is completely free of the influence of corona discharge from the high-tension cords 4, and moreover, the conductive member 6 can be arranged close to the high-tension cords 4, making it possible to design the whole sensor 1 more compact in size and light in weight, as well as prevent deterioration of the conductive member 6 due to the corona discharge and hence prolong the effective life thereof.

Figure 35:
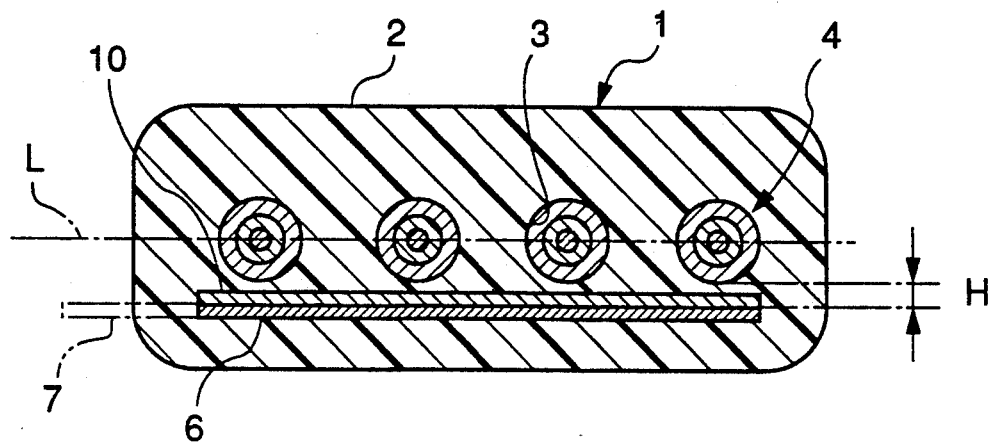
FIG. 35 is a longitudinal sectional view of a sensor of a sparking voltage detecting device according to a twenty-eighth embodiment of the invention.

FIG. 35 shows a twenty-eighth embodiment of the invention. The twenty-eighth embodiment is substantially identical in arrangement with the second embodiment of FIG. 6, except that a single insulating member 10 formed of ceramics is attached to the whole inner side surface of the conductive member 6 facing the through holes 3.

Figure 36:
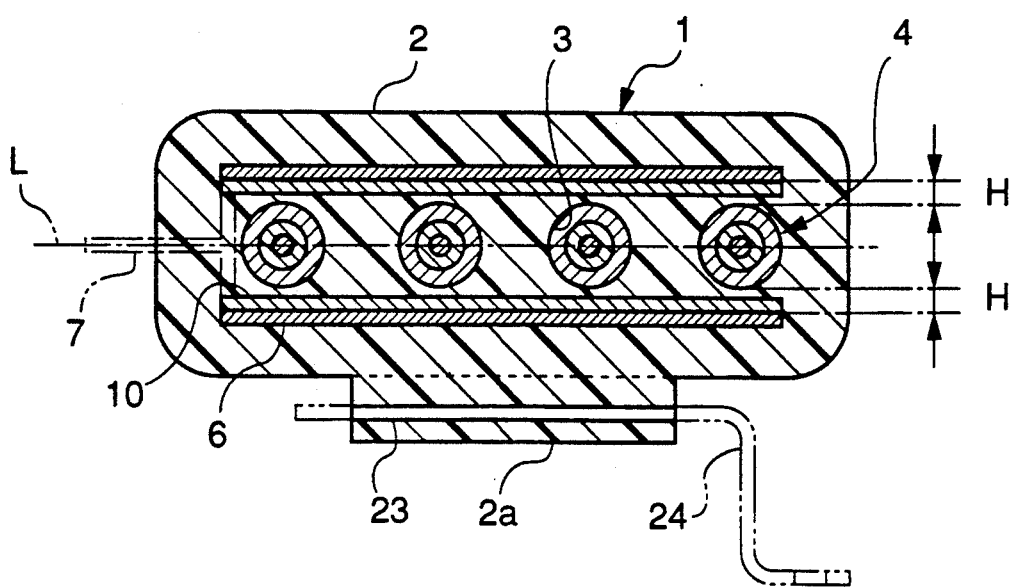
FIG. 36 is a longitudinal sectional view of a sensor of a sparking voltage detecting device according to a twenty-ninth embodiment of the invention.

FIG. 36 shows a twenty-ninth embodiment of the invention. The twenty-ninth embodiment is substantially identical in arrangement with the third embodiment of FIG. 7, except that a pair of insulating members 10 formed of ceramics, which are similar to the insulating member of the twenty-eighth embodiment of FIG. 35, are attached to the whole inner side surfaces of the respective conductive members 6 facing the through holes 3.

Figure 37:
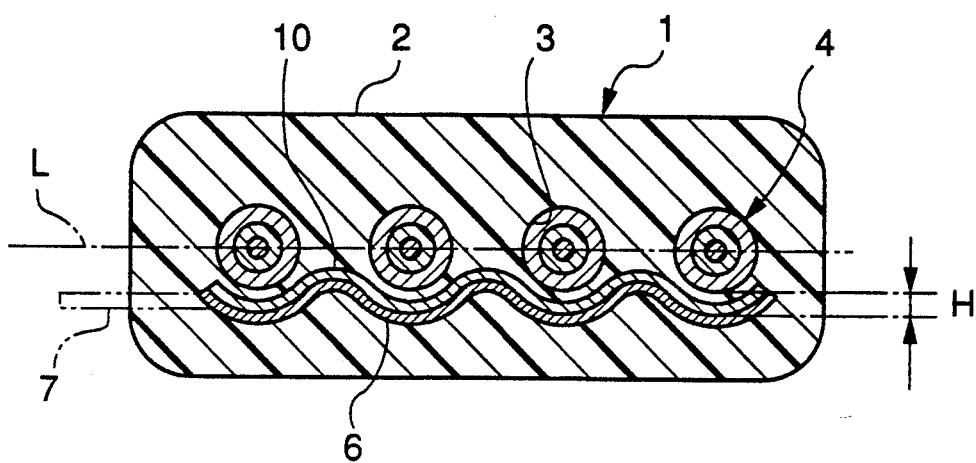
FIG. 37 is a longitudinal sectional view of a sensor of a sparking voltage detecting device according to a thirtieth embodiment of the invention.

FIG. 37 shows a thirtieth embodiment of the invention. The thirtieth embodiment is substantially identical in arrangement with the fourth embodiment of FIG. 8, except that a single corrugated insulating member 10 formed of ceramics is attached to the whole inner side surface of the corrugated conductive member 6 facing the through holes 3.

Figure 38:
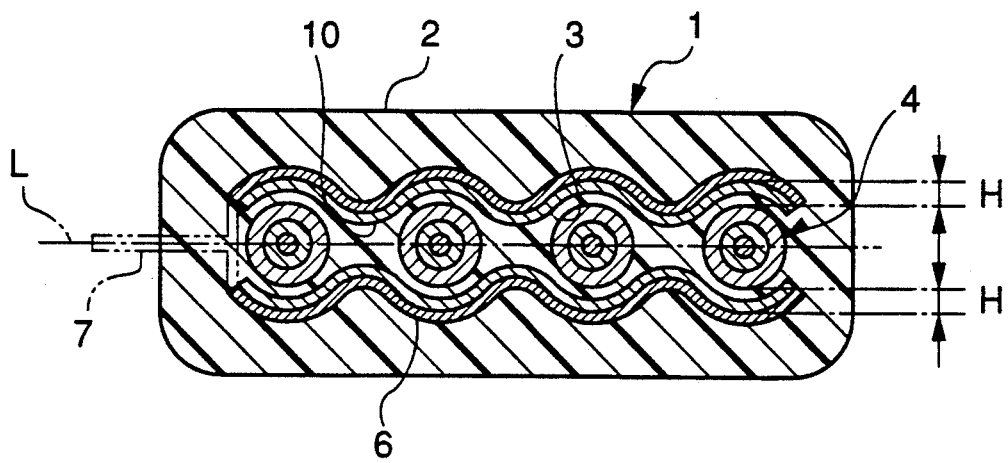
FIG. 38 is a longitudinal sectional view of a sensor of a sparking voltage detecting device according to a thirty-first embodiment of the invention.

FIG. 38 shows a thirty-first embodiment of the invention. The thirty-first embodiment is substantially identical with the fifth embodiment of FIG. 9, except that a pair Of corrugated insulating members 10, which are similar to the corrugated member 10 of the thirtieth embodiment of FIG. 37, are attached to the whole inner side surfaces of the respective corrugated conductive members 6 facing the through holes 3.

Figure 39:
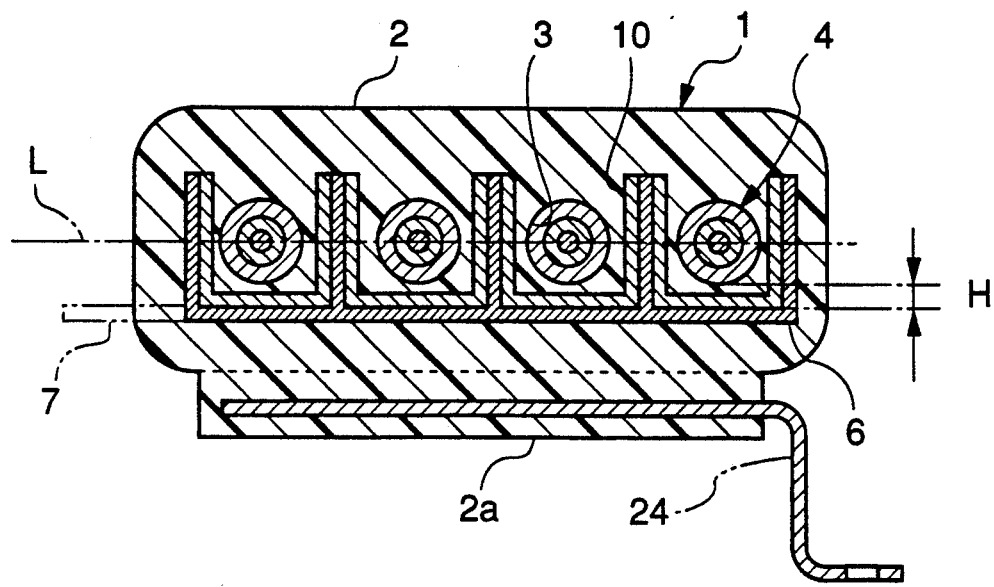
FIG. 39 is a longitudinal sectional view of a sensor of a sparking voltage detecting device according to a thirty-second embodiment of the invention.

FIG. 39 shows a thirty-second embodiment of the invention. The thirty-second embodiment is substantially identical in arrangement with the sixth embodiment of FIG. 10, except that insulating members 10 formed of ceramics and having a U-shaped cross section are attached to the whole inner side surfaces of the conductive member 6 facing the through holes 3.

Figure 40:
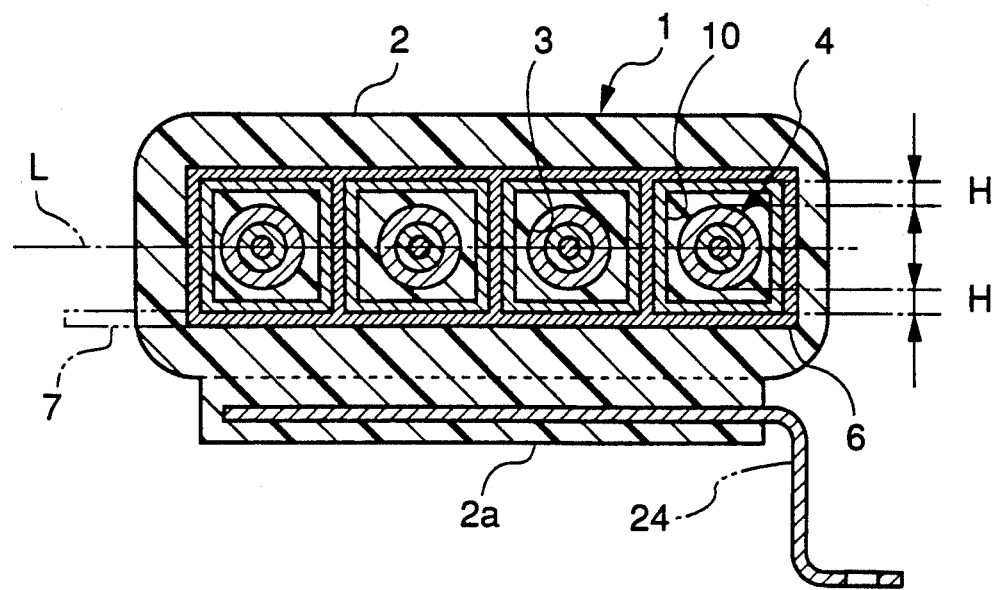
FIG. 40 is a longitudinal sectional view of a sensor of a sparking voltage detecting device according to a thirty-third embodiment of the invention.

FIG. 40 shows a thirty-third embodiment of the invention. The thirty-third embodiment is substantially identical in arrangement with the seventh embodiment of FIG. 11, except that hollow tubular insulating members 10 formed of ceramics and having a square cross section are attached to the whole inner surfaces of the conductive member 6 facing the through holes 3.

Figure 41:
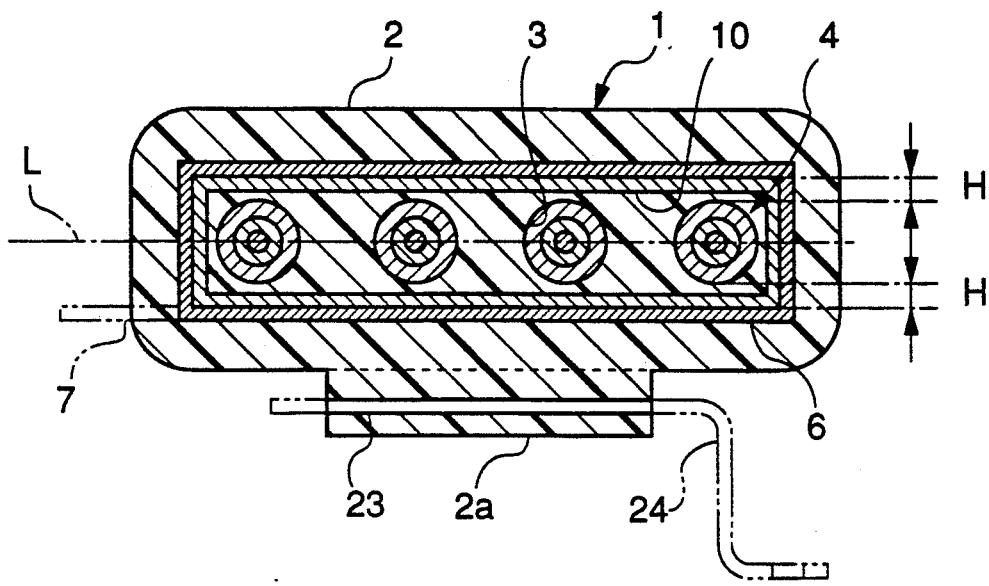
FIG. 41 is a longitudinal sectional view of a sensor of a sparking voltage detecting device according to a thirty-fourth embodiment of the invention.

FIG. 41 shows a thirty-fourth embodiment of the invention. The thirty-fourth embodiment is substantially identical in arrangement with the eighth embodiment of FIG. 12, except that a hollow tubular insulating member 10 formed of ceramics and having a rectangular cross section is attached to the whole inner side surfaces of the conductive member 6 facing the through holes 3.

Figure 42:
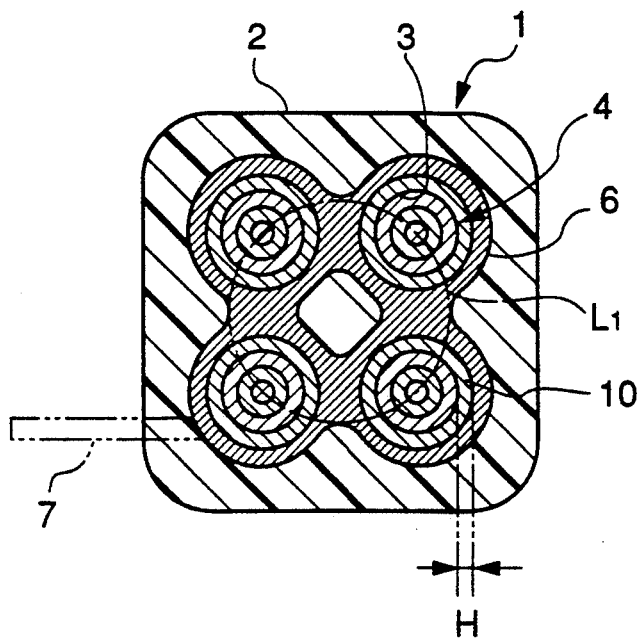
FIG. 42 is a longitudinal sectional view of a sensor of a sparking voltage detecting device according to a thirty-fifth embodiment of the invention.

FIG. 42 shows a thirty-fifth embodiment of the invention. The thirty-fifth embodiment is substantially identical in arrangement with the ninth embodiment of FIG. 13, except that four cylindrical insulating members 10 formed of ceramics are interposed between the respective through holes, i.e. the outer peripheral surfaces of the high-tensions cords 4, and the cylindrical holes of the conductive member 6.

Figure 43:
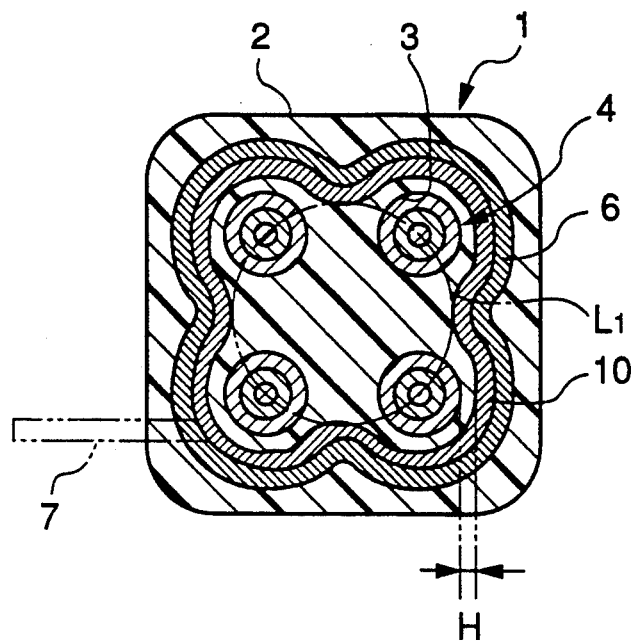
FIG. 43 is a longitudinal sectional view of a sensor of a sparking voltage detecting device according to a thirty-sixth embodiment of the invention.

FIG. 43 shows a thirty-sixth embodiment of the invention. The thirty-sixth embodiment is substantially identical in arrangement with the tenth embodiment of FIG. 14, except that a hollow tubular insulating member 10 formed of ceramics and having a generally square cross section is attached to the whole inner peripheral surface of the hollow tubular conductive member 6 having a generally square cross section and enclosing all the through holes 3.

Figure 44:
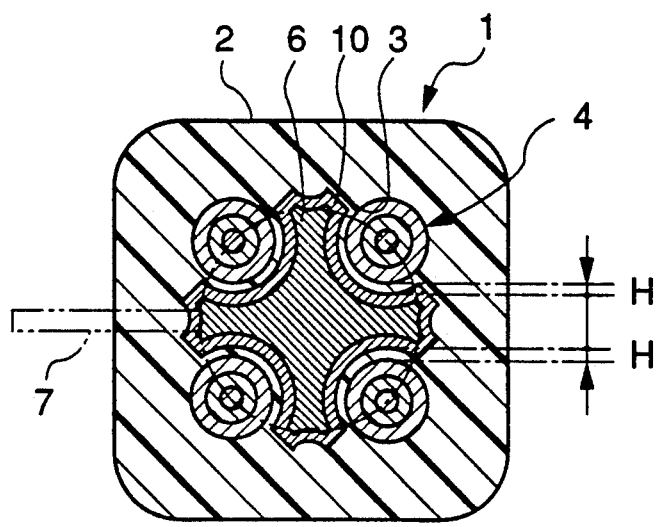
FIG. 44 is a longitudinal sectional view of a sensor of a sparking voltage detecting device according to a thirty-seventh embodiment of the invention.

FIG. 44 shows a thirty-seventh embodiment of the invention. The thirty-seventh embodiment is substantially identical in arrangement with the eleventh embodiment of FIG. 15, except that a hollow tubular insulating member 10 having a generally cruciform cross section is attached to the whole outer peripheral surface of the cruciform conductive member 6 arranged with its center located at a central portion of an area defined between the through holes 3.

Figure 45:
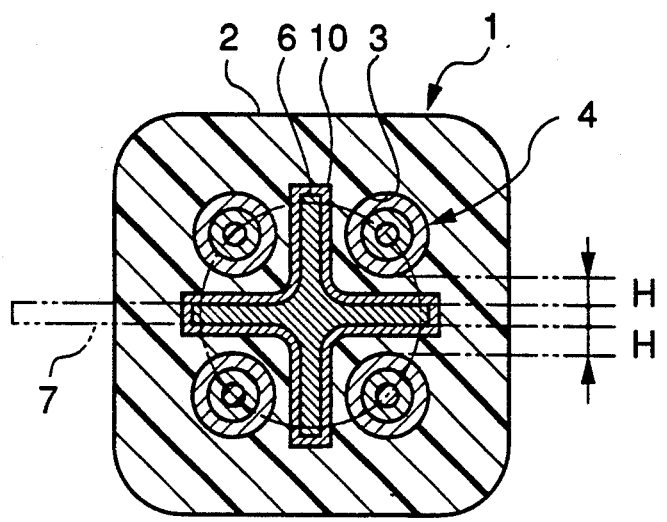
FIG. 45 is a longitudinal sectional view of a sensor of a sparking voltage detecting device according to a thirty-eighth embodiment of the invention.

FIG. 45 shows a thirty-eighth embodiment of the invention. The thirty-eighth embodiment is substantially identical in arrangement with the twelfth embodiment of FIG. 16, except that a hollow insulating member 10 formed of ceramics and having a generally cruciform cross section is attached to the whole outer surfaces of the conductive member 6 having a generally cruciform cross section and arranged with its center located at a central portion of an area defined between the through holes 3.

Figure 46:
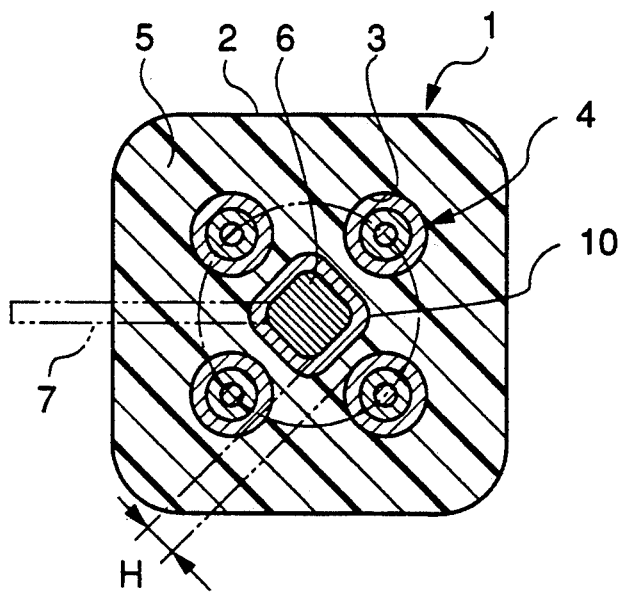
FIG. 46 is a longitudinal sectional view of a sensor of a sparking voltage detecting device according to a thirty-ninth embodiment of the invention.

FIG. 46 shows a thirty-ninth embodiment of the invention. The thirty-ninth embodiment is substantially identical in arrangement with the thirteenth embodiment of FIG. 17, except that a hollow tubular insulating member 10 formed of ceramics and having a generally square cross section is attached to the whole outer peripheral surface of the conductive member 6 in the form of a rod arranged at a central portion of an area defined between the through holes 3.

Figure 47:
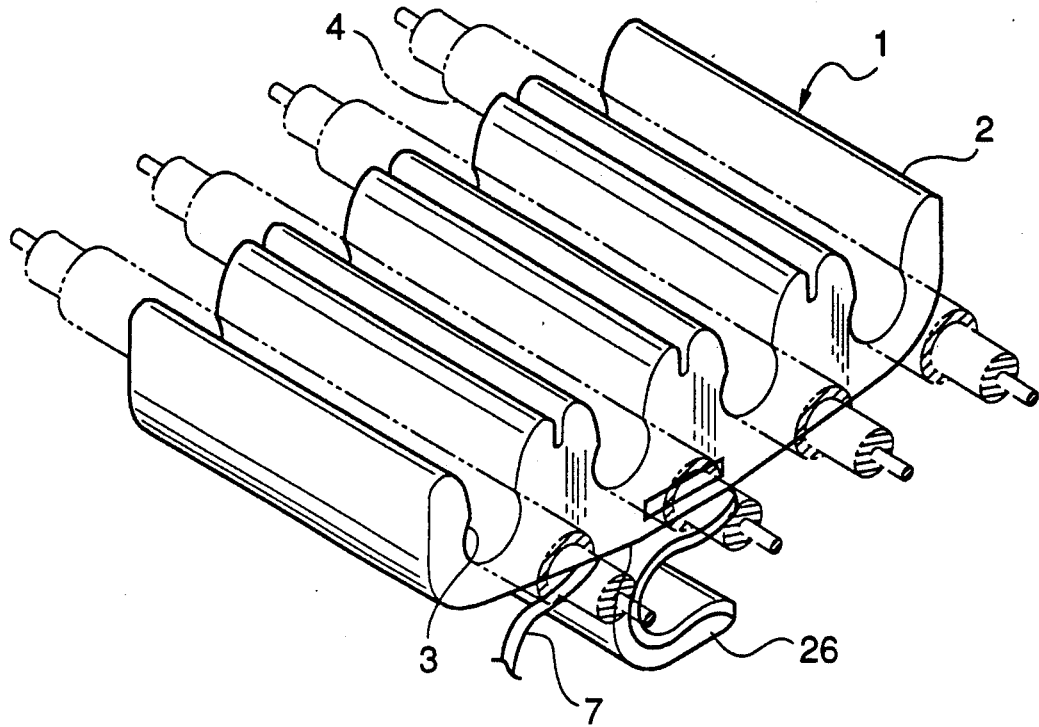
FIG. 47 is a perspective view of a sensor of a sparking voltage detecting device according to a fortieth embodiment of the invention.
Figure 48:
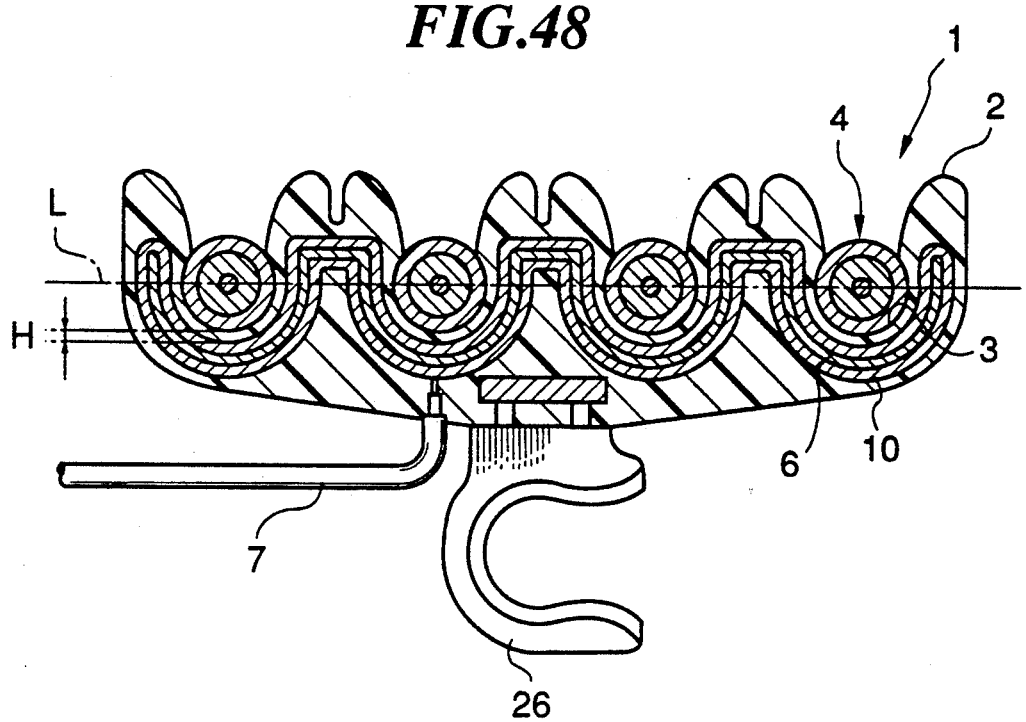
FIG. 48 is a longitudinal sectional view of the sensor of FIG. 47.

FIGS. 47 and 48 show a fortieth embodiment of the invention. In this embodiment, the main body 2 has an identical configuration with that of a cord clamper, not shown, which is mounted on a cylinder head cover, not shown, of an internal combustion engine. The main body 2 thus shaped has an upper side surface thereof formed with a plurality of, e.g. four, through holes 3 in the form of channels having a generally semicircular cross section, the through holes 3 extending parallel with each other. The conductive member 6 has a corrugated platelike configuration and is previously covered with an insulating member 10 formed of ceramics, over all the outer surfaces thereof. The conductive member 6 is embedded together with the insulating member 10 within the main body 2 with its concaved surface portions located correspondingly to the respective through holes 3. One end of the lead wire 7 is connected to the conductive member 6. A fitting member 26 is secured to a lower side surface of the main body 2 for mounting the main body on the cylinder head cover.

Also the fortieth embodiment can provide equivalent results to those of the above described embodiments.

According to the twenty-seventh to fortieth embodiments described above, an insulating member or members formed of ceramics are provided between the through holes and the conductive member or members. As a result, in addition to the effects of the first to thirteenth embodiments described hereinbefore, it is possible to positively prevent the conductive member from undergoing the influence of corona discharge from the high-tension cords and hence arrange the conductive member closer to the high-tension cords to thereby enable to make the whole sensor more compact in size and lighter in weight, while prolonging the effective life of the conductive member(s) due to reduced deterioration of the conductive member, as compared with the first to thirteenth embodiments previously described.

Although in the above described embodiments four through holes 3 are provided in the main body 2, this is not limitative, but the number of the through holes may be set to any other number corresponding to the number of the cylinders of the engine.

Further, although the fourteenth to fortieth embodiments incorporate only the shielding member(s) 8 or the insulating member(s) 10, both the members 8, 10 may be provided in the main body 2.

What is claimed is:

1. A sparking voltage detecting device for an internal combustion engine having an ignition system having at least one secondary side high-tension cord, said sparking voltage detecting device being mounted on said secondary side high-tension cord, for detecting sparking voltage generated in said engine, comprising:
    a main body formed of an insulating material and having at least one through hole formed therein, said high-tension cord being fitted through said through hole in a liquidtight manner; and
    at least one conductive member embedded in said main body at a location radially outward of said through hole and spaced from said high-tension cord by a predetermined distance.

2. A sparking voltage detecting device for an internal combustion engine having a plurality of cylinders, and an ignition system having a plurality of secondary side high-tension cords corresponding in number to the number of said cylinders, said sparking voltage detecting device being mounted on said secondary side high-tension cords, for detecting sparking voltage generated in said engine, comprising:
    a main body formed of an insulating material and having a plurality of through holes formed therein, said through holes corresponding in number to the number of said cylinders, said high-tension cords being fitted, respectively, through said through holes in a liquidtight manner; and
    at least one conductive member embedded in said main body at a location radially outward of said through holes and spaced from said high-tension cords by a predetermined distance.

3. A sparking voltage detecting device for an internal combustion engine having an ignition system having at least one secondary side high-tension cord, said sparking voltage detecting device including a sensor mounted on said secondary side high-tension cord, for detecting sparking voltage generated in said engine, said sensor comprising:
    a main body formed of an insulating material and having at least one through hole formed therein, said high-tension cord being fitted through said through hole in a liquidtight manner; and
    at least one conductive member embedded in said main body at a location radially outward of said through hole and spaced from said high-tension cord by a predetermined distance.

4. A sparking voltage detecting device for an internal combustion engine having a plurality of cylinders, and an ignition system having a plurality of secondary side high-tension cords corresponding in number to the number of said cylinders, said sparking voltage detecting device including a sensor mounted on said secondary side high-tension cords, for detecting sparking voltage generated in said engine, said sensor comprising:
    a main body formed of an insulating material and having a plurality of through holes formed therein, said through holes corresponding in number to the number of said cylinders, said high-tension cords being fitted, respectively, through said through holes in a liquidtight manner; and
    at least one conductive member embedded in said main body at a location radially outward of said through holes and spaced from said high-tension cords by a predetermined distance.

5. A sparking voltage detecting device for an internal combustion engine having an ignition system having at least one secondary side high-tension cord, said sparking voltage detecting device including a sensor mounted on said secondary side high-tension cord, for detecting sparking voltage generated in said engine, said sensor comprising:
    a main body formed of an insulating material and having at least one through hole formed therein, said high-tension cord being fitted through said through hole in a liquidtight manner;
    at least one conductive member embedded in said main body at a location radially outward of said through hole and spaced from said high-tension cord by a predetermined distance; and
    at least one shielding member embedded in said main body at a location outward of said conductive member radially of said through hole.

6. A sparking voltage detecting device for an internal combustion engine having a plurality of cylinders, and an ignition system having a plurality of secondary side high-tension cords corresponding in number to the number of said cylinders, said sparking voltage detecting device including a sensor mounted on said secondary side high-tension cords, for detecting sparking voltage generated in said engine, said sensor comprising:
    a main body formed of an insulating material and having a plurality of through holes formed therein, said through holes corresponding in number to the number of said cylinders, said high-tension cords being fitted, respectively, through said through holes in a liquidtight manner;
    at least one conductive member embedded in said main body at a location radially outward of said through holes and spaced from said high-tension cords by a predetermined distance; and
    at least one shielding member embedded in said main body at a location outward of said conductive member radially of said through holes.

7. A sparking voltage detecting device as claimed in claim 5 or 6, including a lead wire formed of a shielding wire, said lead wire being connected to said conductive member and said shielding member for transmitting a voltage signal generated in said conductive member.

8. A sparking voltage detecting device for an internal combustion engine having an ignition system having at least one secondary side high-tension cord, said sparking voltage detecting device including a sensor mounted on said secondary side high-tension cord, for detecting sparking voltage generated in said engine, said sensor comprising:

a main body formed of an insulating material and having at lest one through hole formed therein, said high-tension cord being fitted through said through hole in a liquidtight manner;

at least one conductive member embedded in said main body at a location radially outward of said through hole and spaced from sad high-tension cord by a predetermined distance; and at least one insulating member formed of ceramics, said insulating member being embedded in said main body at a location between said through hole and said conductive member.

9. A sparking voltage detecting device as claimed in any of claims 1, 3, 5, or 8, wherein said conductive member comprises a conductive member arranged at one lateral side of said main body with respect to said through hole.

10. A sparking voltage detecting device as claimed in any of claims 1, 3, 5, or 8, wherein said conductive member comprises a pair of conductive members symmetrically arranged at opposite lateral sides of said main body with respect to said through hole.

11. A sparking voltage detecting device as claimed in any of claims 1, 3, 5, or 8, wherein said through hole has a diameter larger than an outer diameter of said high-tension cord, said through hole having opposite ends thereof formed with annular lips disposed in liquidtight contact with an outer peripheral surface of said high-tension cord for preventing infiltration of water into a clearance between said through hole and said high-tension cord.

12. A sparking voltage detecting device for an internal combustion engine having a plurality of cylinders, and an ignition system having a plurality of secondary side high-tension cords corresponding in number to the number of said cylinders, said sparking voltage detecting device including a sensor mounted on said secondary side high-tension cord, for detecting sparking voltage generated in said engine, said sensor comprising:

a main body formed of an insulating material and having a plurality of through hoes formed therein, said through holes corresponding in number to the number of said cylinders, said high-tension cords being fitted, respectively, through said through holes in a liquidtight manner;

at least one conductive member embedded in said main body at a location radially outward of said through holes and spaced from said high-tension cords by a predetermined distance; and.

at least one insulating member formed of ceramics, said insulating member being embedded in said main body at a location between said through holes and said conductive member.

13. A sparking voltage detecting device as claimed in any of claim 2, 4, 6, or 12, wherein said through holes are disposed in a manner such that centers thereof are located along a line intersecting with axes thereof at right angles, said through holes being arranged at equal intervals in a direction perpendicular to said axes.

14. A sparking voltage detecting device as claimed in claim 13, wherein said conductive member comprises a conductive member arranged at one lateral side of said main body with respect to said through holes.

15. A sparking voltage detecting device as claimed in claim 13, wherein said conductive member comprises a pair of conductive members symmetrically arranged at opposite lateral sides of said main body with respect to said through holes.

16. A sparking voltage detecting device as claimed in claim 13, wherein said conductive member has a plurality of portions facing respective ones of said through holes, said portions being combined with each other.

17. A sparking voltage detecting device as claimed in any of claims 2, 4, 6, or 12, wherein said through holes are disposed in a manner such that centers thereof are located along a circle formed about a central portion of said main body, said through holes being circumferentially arranged at equal intervals.

18. A sparking voltage detecting device as claimed in claim 17, wherein said conductive member has a plurality of portions facing respective ones of said through holes, said portions being combined with each other.

19. A sparking voltage detecting device as claimed in any of claims 2, 4, 6, or 12, wherein said conductive member comprises a conductive member arranged at one lateral side of said main body with respect to said through holes.

20. A sparking voltage detecting device as claimed in any of claims 2, 4, 6, or 12, wherein said conductive member comprises a pair of conductive members symmetrically arranged at opposite lateral sides of said main body with respect to said through holes.

21. A sparking voltage detecting device as claimed in any of claims 2, 4, 6, or 12, wherein said through holes each have a diameter larger than an outer diameter of said high-tension cord, said through holes each having opposite ends thereof formed with annular lips disposed in liquidtight contact with an outer peripheral surface of a corresponding one of said high-tension cords for preventing infiltration of water into a clearance between said each through hole and said corresponding high-tension cord.

22. A sparking voltage detecting device as claimed in any one of claims 1 to 6, 8 and 12 including a lead wire formed of a shielding wire, said lead wire being connected to said conductive member for transmitting a voltage signal generated in said conductive member.

* * * * *